(12) United States Patent
Hirai

(10) Patent No.: US 7,220,682 B2
(45) Date of Patent: May 22, 2007

(54) PATTERN AND FABRICATING METHOD THEREFOR, DEVICE AND FABRICATING METHOD THEREFOR, ELECTRO-OPTICAL APPARATUS, ELECTRONIC APPARATUS, AND METHOD FOR FABRICATING ACTIVE MATRIX SUBSTRATE

(75) Inventor: Toshimitsu Hirai, Chino (JP)

(73) Assignee: Seiko Epson Corporation, Tokyo (JP)

(*) Notice: Subject to any disclaimer, the term of this patent is extended or adjusted under 35 U.S.C. 154(b) by 209 days.

(21) Appl. No.: 10/840,296

(22) Filed: May 7, 2004

(65) Prior Publication Data

US 2005/0003166 A1 Jan. 6, 2005

(30) Foreign Application Priority Data

| May 12, 2003 | (JP) | ............................. 2003-133284 |
| May 12, 2003 | (JP) | ............................. 2003-133285 |
| Apr. 14, 2004 | (JP) | ............................. 2004-118838 |

(51) Int. Cl.
*H01L 21/288* (2006.01)
*B05D 1/38* (2006.01)

(52) U.S. Cl. ................. 438/763; 427/470; 257/E21.174
(58) Field of Classification Search ................ 438/500, 438/502, 761; 427/466, 468, 470
See application file for complete search history.

(56) References Cited

U.S. PATENT DOCUMENTS 5,132,248 A    7/1992   Drummond et al.

| 6,610,552 | B2 | 8/2003 | Fujimori et al. |
| 6,667,443 | B2 | 12/2003 | Kondo et al. |
| 6,905,906 | B2* | 6/2005 | Sirringhaus et al. ........... 438/99 |
| 2001/0001050 | A1* | 5/2001 | Miyashita et al. ........... 428/690 |
| 2003/0030689 | A1 | 2/2003 | Hashimoto et al. |
| 2003/0059987 | A1 | 3/2003 | Sirringhaus et al. |
| 2003/0083203 | A1 | 5/2003 | Hashimoto et al. |
| 2003/0143339 | A1* | 7/2003 | Kobayashi ................... 427/558 |
| 2005/0196969 | A1* | 9/2005 | Gunner et al. .............. 438/725 |

FOREIGN PATENT DOCUMENTS

| CN | 090130808 | 5/1992 |
| CN | 1320011 A | 10/2001 |
| EP | 0 862 156 A1 | 9/1998 |
| EP | 0 930 641 A2 | 7/1999 |
| EP | 1 357 772 A2 | 10/2003 |
| JP | A 5-265040 | 10/1993 |
| JP | A 10-161093 | 6/1998 |
| JP | HEI 11-274671 | 10/1999 |
| JP | 2000-216330 | 8/2000 |
| JP | A 2002-164635 | 6/2002 |
| JP | A 2003-059940 | 2/2003 |
| JP | A 2003-124215 | 4/2003 |

* cited by examiner

*Primary Examiner*—Carl Whitehead, Jr.
*Assistant Examiner*—Jennifer M Dolan
(74) *Attorney, Agent, or Firm*—Oliff & Berridge, PLC

(57) ABSTRACT

A method for fabricating a pattern on a substrate, includes the steps of forming banks according to formation areas of the pattern on the substrate, disposing a first function liquid between the banks, disposing a second function liquid on the first function liquid, and applying predetermined treatments to the first and the second function liquids which are disposed between the banks so as to form the pattern with plural materials stacked one on the other.

23 Claims, 17 Drawing Sheets

PATTERN AND FABRICATING METHOD THEREFOR, DEVICE AND FABRICATING METHOD THEREFOR, ELECTRO-OPTICAL APPARATUS, ELECTRONIC APPARATUS, AND METHOD FOR FABRICATING ACTIVE MATRIX SUBSTRATE

BACKGROUND OF THE INVENTION

1. Field of the Invention

The present invention relates to a pattern and to a fabricating method therefor, to a device and to a fabricating method therefor, to an electro-optical apparatus, to an electronic apparatus, and to a method for fabricating an active matrix substrate.

Priority is claimed on Japanese Patent Application No. 2003-133284, filed May 12, 2003, Japanese Patent Application No. 2003-133285, filed May 12, 2003, and Japanese Patent Application No. 2004-118838, filed Apr. 14, 2004, the contents of which are incorporated herein by reference.

2. Description of the Related Art

Up to now, as a fabricating method for a fine wiring pattern (pattern) of a semiconductor integrated circuit and the like, photolithography methods are frequently used. On the other hand, Japanese Unexamined Patent Application, First Publication No. 11-274671 and Japanese Unexamined Patent Application, First Publication No. 2000-216330 disclose methods of using liquid droplet ejecting systems. The technology disclosed in these documents positions materials on a pattern formation surface by ejecting function liquid (ink for a wiring pattern), containing a pattern forming material (conductive fine particles), on a substrate from a droplet ejecting head, to form a wiring pattern. Hence, it is said that this is very effective since this technology is applicable to a multi-product and small scale production system.

The high densification of circuits constituting devices in recent years advances increasingly, and further miniaturization and thinning is demanded also for, for example, wiring patterns.

However, when it is intended to form such a fine wiring pattern by a method according to the above-mentioned liquid droplet ejecting systems, it is particularly difficult to fully achieve the accuracy of the wiring width. Hence, proposed methods are those of providing on a substrate banks which are partition members, and performing surface finishing so that upper portions of the banks are made liquid-repelling and the other portions are made to have liquid-affinity.

On the other hand, since the banks are formed by using a photolithography method, there is a possibility of cost increase. Hence, it is also proposed to selectively eject ink for a wiring pattern on liquid-affinity sections of the substrate where the liquid-repelling sections (liquid-repelling areas) and liquid-affinity sections (lyophilic areas) are patterned beforehand by a liquid droplet ejecting system. In this case, since the ink for a wiring pattern where conductive fine particles are dispersed tends to collect on the liquid-affinity sections, it is possible to form a wiring pattern while keeping positional accuracy without forming the banks.

Since the above-described wiring pattern is made of one kind of metal, it does not usually have a function except the function of allowing a current to flow, which is a main function as wiring. Hence, for example, since the adhesion of the wiring pattern is weak, there arise various problems in that it peels off from the substrate, and in that short circuiting is generated by the electromigration of the wiring pattern.

SUMMARY OF THE INVENTION

The present invention is made in view of the above-described problems, and an object thereof is to provide a pattern the functionality, which is not obtained by one kind of material, by stacking a plurality of materials and fabricating a pattern.

In order to achieve the above-mentioned object, the present invention provides a method for fabricating a pattern on a substrate, including the steps of: forming banks according to formation areas of the pattern on the substrate; disposing a first function liquid between the banks; disposing a second function liquid on the first function liquid; and applying predetermined treatments to the first and the second function liquids which are disposed between the banks so as to form the pattern with plural materials stacked one on the other.

According to the method for fabricating a pattern according to the present invention which has such a feature, the pattern formed by stacking the plurality of materials is formed between the banks formed on the substrate. It thereby becomes possible to impart the functionality, which is not obtained by one kind of material, to the pattern.

In addition, in the step of disposing the second function liquid on the first function liquid, the second function liquid, which is different from the fit function liquid, may preferably be disposed on the first function liquid after solidifying the first function liquid so that the first and second function liquids, which are different from each other, are disposed between banks.

Owing to this, since the function liquid having previously been disposed between the banks does not mix with the function liquid disposed between banks later, it becomes possible to dispose and stack securely different types of function liquid between the banks. In addition, the pattern of three or more layers can be also formed by repeating this by disposing and stacking three or more types of function liquid between the banks.

In addition, when the banks are made of a material which does not have liquid-repellency beforehand, it is preferable to include a step of imparting liquid-repellency to surfaces of the banks before disposing the first and second function liquids between the banks. Owing to this, it becomes possible to make, for example, the function liquid, reaching top faces of the banks, flow in between the banks securely by being repelled from the top faces of the banks.

In addition, it is preferable to include a step of imparting liquid-affinity to a surface of the substrate exposed between the banks before disposing the function liquid between the banks. Hence, since the function liquid disposed on the substrate exposed between the banks tends to wet and spread, it becomes possible to dispose the function liquid uniformly on the substrate where the function liquid is ejected between the banks.

The present invention further provides a method for fabricating a pattern on a substrate, including the steps of: forming a function liquid application region corresponding to a formation region of the pattern, and a liquid-repelling region surrounding the function liquid application region, on the substrate; disposing a first function liquid on the function liquid application region; disposing a second function liquid on the first function liquid; and applying predetermined treatments to the first and the second function liquids which are disposed on the function liquid application region so as to form the pattern with plural materials stacked one on the other.

According to the method for fabricating a pattern according to the present invention which has such a feature, the pattern formed by stacking the plural materials is formed on the function liquid application region formed on the substrate. It thereby becomes possible to impart the functionality, which is not obtained by one kind of material, to the pattern.

In addition, in the step of disposing the second function liquid on the first function liquid, the second function liquid, which is different from the first function liquid, may preferably be disposed on the first function liquid after solidifying the first function liquid that has been disposed on the function liquid application region so that the first and second function liquids, which are different from each other, are disposed on the function liquid application region.

Owing to this, since the function liquid having previously been disposed on the function liquid application region does not mix with the function liquid disposed on the function liquid application region later, it becomes possible to dispose and stack securely different types of function liquid on the function liquid application region. In addition, three or more layers of pattern can be also formed by repeatedly disposing and stacking three or more types of function liquid on the function liquid application region.

In the present invention, the liquid-repelling region may preferably be a region which is made liquid-repelling by forming a monomolecular film on the substrate. The monomolecular film may preferably be a self-organizing film made of organic molecules. In this case, it is possible to form a monomolecular film easily.

In addition, the liquid-repelling region may be made liquid-repelling by forming a fluoro-polymer film, instead of a monomolecular film, on the substrate. Formation of the fluoro-polymer film can be easily made using a plasma processing in which, for example, a fluorocarbon group compound, is used as a reactive gas.

It is preferable to impart liquid-affinity to the function liquid application region, and in this case, it is possible to preferably adopt the irradiation of ultraviolet light, plasma treatment where oxygen is used as a reactive gas, or the processing of exposing a substrate to an ozone ambient atmosphere. In this case, since it is possible to partially and uniformly break a liquid-repelling film which is once formed, it is possible to reduce liquid-repellency, and to obtain desired liquid-affinity in a uniform manner.

Since it is possible to make the pattern electroconductive by making the function liquid contain conductive fine particles, it is possible to form the pattern as wirings.

When the function liquid includes a material which exhibits electroconductivity by being subjected to a heat treatment or a light irradiation treatment, it is possible to make a pattern a wing pattern by giving heat treatment or light irradiation treatment to the function liquid disposed between banks or on a function liquid application region.

When a pattern according to the present invention contains a layer constituted of a main material which bears main functions of the pattern, and a layer made of a material for enhancing the adhesion between this main material and a substrate, it becomes possible to prevent the main material from peeling off from the substrate.

In the present invention the main material is a material which has main functions of a pattern, and for example, when forming the pattern as wiring, the main material may be silver or steel which mainly bears the function of allowing a current to flow.

In addition, for the material for enhancing the adhesion between the main material and substrate, chromium, manganese, iron, nickel, molybdenum, titanium, tungsten, or the like may be used.

When the pattern according to the present invention includes a layer constituted of the above-mentioned main material, and a layer made of a material for suppressing the electromigration of this main material, it becomes possible to suppress the electromigration of the main material.

The electromigration is a phenomenon in which atoms move in accordance with an electron flow by flowing a current in wiring for a long time, and this causes the increase of resistance of wiring, and the breaking of a wire.

Titanium or the like may be used for a material which suppresses this electromigration.

When the pattern according to the present invention includes a layer constituted of the above-mentioned main material, and a layer made of a material which prevents the oxidation of this main material, it becomes possible to prevent the wiring from oxidation by the open air or the like.

When the pattern according to the present invention includes a layer constituted of the above-mentioned main material, and a layer made of a material which protects the main material from damage, it becomes possible to prevent wiring from damage by an external force (when forming a thin film further on the pattern of the present invention, or the like).

In addition, chromium, nickel, tungsten, tantalum, or the like may be used for materials which prevent the oxidation of the main material and as materials which protect the main material from damage.

In addition, the pattern according to the present invention may include a layer constituted of the above-mentioned main material and an auxiliary electrode layer made of Indium Tin Oxide (ITO) or Antimony-doped Tin Oxide (ATO) instead of the above-described materials.

The present invention further provides a method for fabricating a device. The method includes a step of forming a pattern on a substrate using the above-mentioned method for fabricating a pattern according to the present invention.

According to the method for fabricating a device which has such features, it becomes possible to produce a device having a pattern formed by stacking materials which have a plurality of different functions as wiring connected to, for example, a switching device.

The present invention further provides an electro-optical apparatus including a device produced by using the above-described method for fabricating a device.

The present invention further provides an electronic apparatus including the above-described electro-optical apparatus.

Owing to this, the present invention makes it possible to obtain an electro-optical apparatus and an electronic apparatus which each are provided with a pattern having a plurality of functionalities.

The present invention further provides a method for fabricating an active matrix substrate, including: a first step of forming a gate wiring on a substrate; a second step of forming a gate insulating film on the gate wiring; a third step of stacking a semiconductor layer while having the gate insulating film intervened; a fourth step of forming a source electrode and a drain electrode on the gate insulating film; a fifth step of disposing an insulating material on the source electrode and the drain electrode; and a sixth step of forming a pixel electrode on the insulating material, wherein the above-mentioned method for fabricating a pattern according the present invention is used in at least one of the first step, the fourth step, and the sixth step.

According to the method for fabricating an active matrix substrate according to the present invention like this, it is possible to produce an active matrix substrate which is given the functionality, which is not obtained by one type of material, to the gate wiring, source electrode and drain electrode, and pixel electrode.

DETAILED DESCRIPTION OF THE PREFERRED EMBODIMENTS

Figure 1:
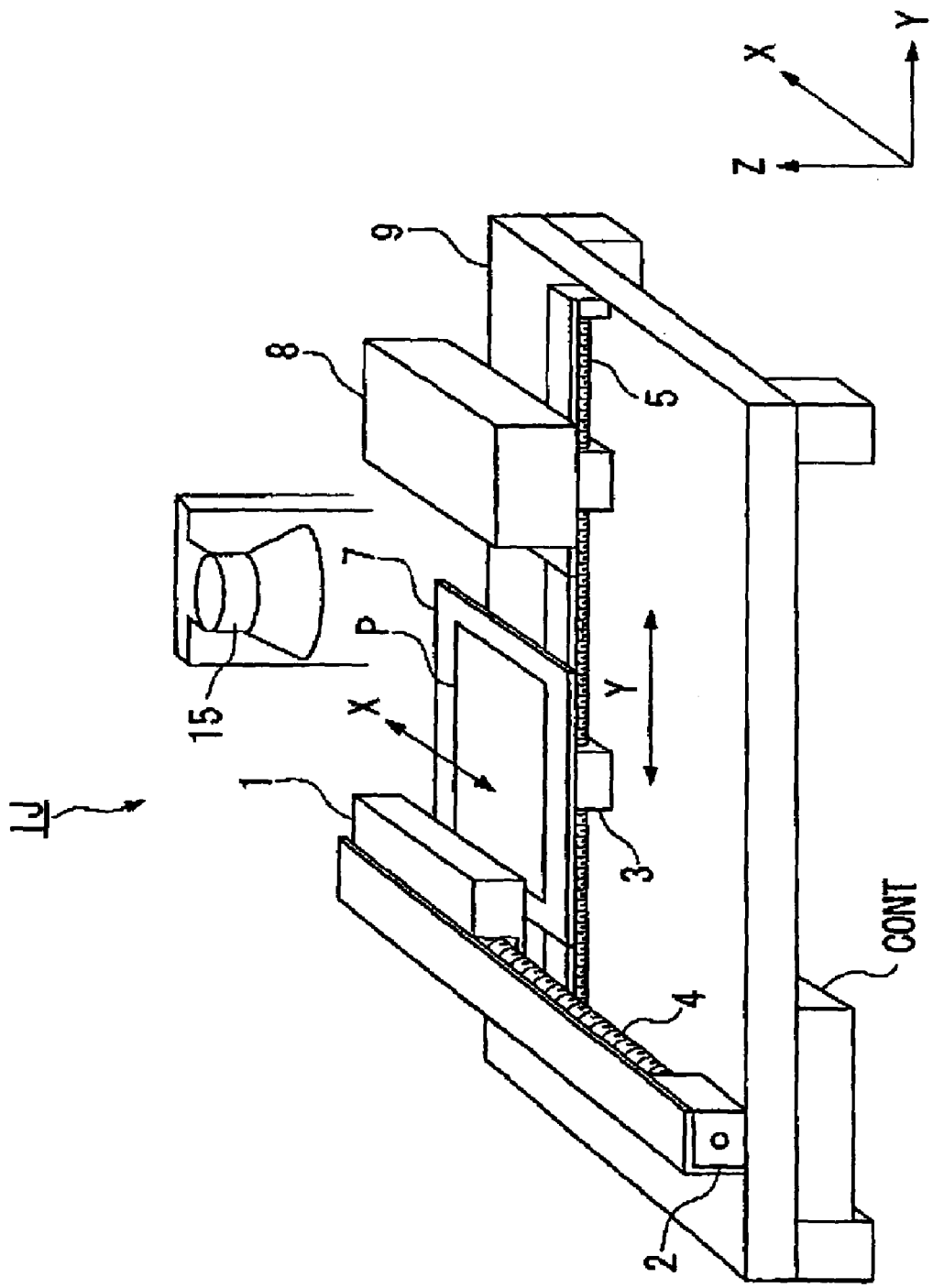
FIG. 1 is a schematic perspective view of a liquid droplet ejecting apparatus.

Hereafter, with reference to drawings, embodiments of a pattern and a fabricating method thereof, a device and a production method thereof, an electro-optical apparatus, an electronic apparatus, and a production method of an active matrix substrate which relate to the present invention will be explained. In each drawing which is referred to, the scale is different for each layer or each member so that each layer and each member can be depicted in the drawing.

First Embodiment

In this embodiment, a case will be explained, in which a wiring pattern including a plurality of conductive films is formed between banks that are formed depending on the wiring pattern on a substrate, by ejecting ink (function liquid) for a wiring pattern (pattern), which contains conductive fine particles, from an ejecting nozzle of a liquid droplet ejecting head by a liquid droplet ejecting method.

This ink for a wiring pattern includes dispersion liquid, where conductive fine particles are dispersed in a dispersion medium and a solution where an organic silver compound or silver oxide nano-particles are dispersed in a solvent (dispersion liquid).

In this embodiment, fine metal particles containing any one of, for example, gold, silver, copper, iron, chrome, manganese, molybdenum, titanium, palladium, tungsten, and nickel, oxides of these, and conductive polymers or fine particles of superconductor, etc. are used as the conductive fine particles.

It is also possible to use these conductive fine particles which are coated with organic substances, etc., on their surfaces, in order to enhance dispersibility.

It is preferable that the particle diameter of the conductive fine particles is not less than 1 nm and not larger than 0.1 µm. If it is larger than 0.1 µm, there is a possibility that clogging may occur in an ejecting nozzle of a liquid ejecting head described below. In addition, if it is smaller than 1 nm, a volume ratio of a coating agent to the conductive fine particles becomes large, and hence, a ratio of an organic substance in the film obtained becomes excessive.

The dispersion medium is not especially limited so long as it can disperse the above-described electroconductive fine particles and does not cause cohesion. For example, substances which can exemplify this are, in addition to water, alcohols such as methanol, ethanol, propanol, and butanol, hydrocarbon system compounds such as n-heptane, n-octane, decane, dodecane, tetra-decane, toluene, xylene, cymene, duren, indene, dipentene, tetrahydronaphthalene, decahydronaphthalene, and cyclohexylbenzene, ether group compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy ethane, bis(2-methoxy ethyl)ether, and p-dioxane, and furthermore, polar compounds such as propylene carbonate, gamma-butyrolactone, N-methyl-2-pyrrolidone, dimethylformamide, dimethyl sulfoxide, and cyclohexanone. Among these, in respect of the dispersibility of fine particles, the stability of dispersion liquid, and the ease of application to the liquid droplet ejecting method (ink-jet method), it is possible to preferably cite water, an alcohol, a hydrocarbon group compound, and an ether group compound, and to cite the water, and hydrocarbon group compound as a more preferable dispersion medium.

It is preferable that the surface tension of a dispersion liquid of the above-mentioned conductive fine particles be in a range of 0.02 to 0.07 N/m. If the surface tension is less than 0.02 N/m when liquid is ejected by the ink-jet method, wettability of ink compositions to an ejecting nozzle face increases, and hence, it becomes easy to cause misdirected ejection. On the other hand, since the shape of the meniscus in an ejecting nozzle tip is not stabilized if the surface tension exceeds 0.07 N/m, it becomes difficult to control ejection and ejection timing. In order to adjust the surface tension, a small amount of surface tension modifier, such as a fluorine group, silicone group, or nonionic group modifier, in a range in which a contact angle with a substrate is not greatly reduced, may preferably be added in the above-mentioned dispersion liquid. The nonionic group surface tension modifier enhances the wettability of liquid to a substrate, improves the leveling property of a film, and is useful for prevention of generation of fine irregularities in the film etc. The above-mentioned surface tension modifier may also include organic compounds such as an alcohol, ether, ester, and ketone, if necessary.

It is preferable for the viscosity of the above-mentioned dispersion liquid to be not less than 1 mPa·s and not more than 50 mPa·s. If the viscosity is less than 1 mPa·s when a liquid material is ejected as a liquid droplet using the ink-jet method, a part around an ejecting nozzle tends to be polluted by the spillover of ink. In addition, if the viscosity is greater than 50 mPa·s, the ejecting nozzle hole is frequently clogged, and hence, it becomes difficult to smoothly eject a liquid droplet.

As a substrate on which a wiring pattern is formed, it is possible to use various kinds of materials such as glass, quartz glass, a silicon wafer, a plastic film, and a metal plate. In addition, the materials also include these various kinds of material substrates where semiconductor films, metal films, dielectric films, organic films, etc. are formed on their surfaces as base layers, respectively.

In a method for ejecting a liquid droplet, a charging control system, a pressurized vibration system, an electromechanical transformation system, an electrothermal transformation system, an electrostatic attraction system, etc., may be used. The charging control system gives electric charges to a material with a charging electrode, controls a flying direction of the material by a deflecting electrode, and makes the material be ejected from an ejecting nozzle. In addition, the pressurizing vibration system applies about 30 kg/cm$^2$ of super high pressure to a material to make the material be ejected toward an ejecting nozzle tip. When a control voltage is not applied, the material goes straight on to be ejected from the ejecting nozzle, and when the control voltage is applied, electrostatic repulsion between materials occurs, and the materials scatter so as not to be ejected from the ejecting nozzle. In addition, the electromechanical transformation system uses the property that a piezo-electric element deforms in response to a pulsed electrical signal. When the piezoelectric element deforms, pressure is given via a flexible substance to a space which stores a material, and the material is extruded from this space so as to be ejected from the ejecting nozzle.

In addition, the electrothermal transformation system makes a bubble generated by rapidly vaporizing a material with a heater provided in a space which stores the material, and makes the material in the space be ejected by the pressure of the bubble. An electrostatic attraction system applies minute pressure to a space which stores a material, forms a meniscus of the material in an ejecting nozzle, and draws out the material after applying electrostatic attraction in this state. Futhermore, in addition to these, it is also possible to apply technology such as a system of using a viscosity change of fluid by an electric field, and a system of ejecting a material by an electrical discharge spark. The liquid droplet ejecting method has advantages that the use of the material has little waste, and moreover, a desired amount of material can be exactly disposed in a desired position. In addition, one drop of amount of the liquid material (fluid) ejected by a liquid droplet ejecting method is, for example, 1 to 300 ng.

Next, an apparatus for fabricating a device of the present invention will be explained.

A liquid droplet ejecting apparatus (ink-jet apparatus) which produces a device by ejecting (discharging) a liquid droplet from a droplet ejecting head to a substrate is used as this device production apparatus.

FIG. 1 is a perspective view showing the schematic construction of a liquid droplet ejecting apparatus IJ.

The liquid droplet ejecting apparatus IJ includes a droplet ejecting head 1, an X-axis direction drive shad 4, a Y-axis direction guide shaft 5, a controller CONT, a stage 7, a cleaning mechanism 8, a base 9, and a heater 15.

The stage 7 supports a substrate P on which a liquid material (ink for wiring patterns) is provided by this liquid droplet ejecting apparatus IJ, and includes a clamping mechanism, which is not shown, but fixes the substrate P to a reference position.

The droplet ejecting head 1 is a multi-nozzle type droplet ejecting head provided with a plurality of ejecting nozzles, and its longitudinal direction coincides with the X-axis direction. The plurality of ejecting nozzles is provided in the bottom face of the droplet ejecting head 1 at regular intervals. From the ejecting nozzle of the droplet ejecting head 1, ink for wiring patterns containing the above-mentioned conductive fine particles is ejected to the substrate P supported by the stage 7.

The X-axis direction drive motor 2 is connected to the X-axis direction drive shaft 4. The X-axis direction drive motor 2 is a step motor etc., and when an X-axis direction drive signal is supplied from the controller CONT, it rotates the X-axis direction drive shaft 4. When the X-axis direction drive shaft 4 is rotated, the droplet ejecting head 1 moves in the X-axis direction.

The Y-axis direction guide shaft 5 is fixed so that it may not move toward the base 9. The stage 7 includes a Y-axis direction drive motor 3. The Y-axis direction drive motor 3 is a step motor, etc., and when a Y-axis direction drive signal is supplied from the controller CONT, it moves the stage 7 in the Y-axis direction.

The controller CONT supplies a voltage for the ejection control of liquid droplets to the droplet ejecting bead 1. In addition, the controller CONT supplies a drive pulse signal controlling the movement of the droplet ejecting head 1 in the X-axis direction to the X-axis direction drive motor 2, and supplies a drive pulse signal controlling the movement of the stage 7 in the Y-axis direction to the Y-axis direction drive motor 3.

The cleaning mechanism 8 cleans the droplet ejecting head 1. The cleaning mechanism 8 is provided with a Y-axis direction drive motor, not shown By the driving of this drive motor in the Y-axis direction, the cleaning mechanism moves along the Y-axis direction guide shaft 5. The movement of the cleaning mechanism 8 is also controlled by the controller CONT.

The heater 15 is a means of beat treating the substrate P by lamp annealing, and performs the vaporization and drying of a solvent contained in a liquid material applied on the substrate P. The power-on and power-off of this heater 15 are also controlled by the controller CONT.

The liquid droplet ejecting apparatus IJ ejects a liquid droplet to the substrate P with relatively scanning the droplet ejecting head 1 and stage 7 supporting the substrate P from a plurality of ejecting nozzles arranged in the X-axis direction in the bottom face of the droplet ejecting head 1.

Figure 2:
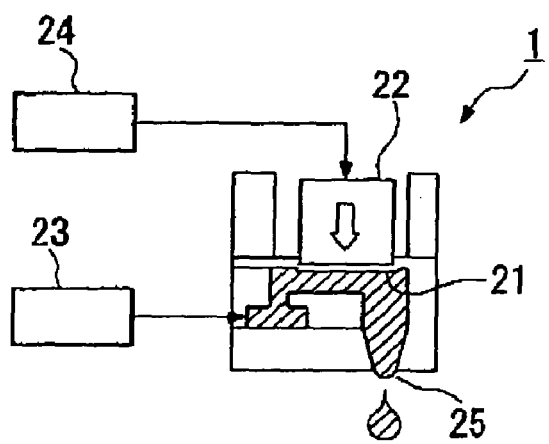
FIG. 2 is a diagram for explaining an ejection principle of a liquid material by a piezo system.

FIG. 2 is a diagram for explaining an ejection principle of a liquid material by a piezoelectric system.

In FIG. 2, a piezo-electric element 22 is installed adjacent to a liquid chamber 21 containing a liquid material (ink for wiring patterns, function liquid). The liquid material is supplied to the liquid chamber 21 via a liquid material supply system 23 including a material tank containing the liquid material. The piezo-electric element 22 is connected to a drive circuit 24. By applying a voltage to the piezo-electric element 22 via this drive circuit 24 to deform the piezo-electric element 22, the liquid chamber 21 deforms for the liquid material to be ejected from an ejecting nozzle 25. In this case, a distortion amount of the piezo-electric element 22 is controlled by changing the value of the applied voltage. In addition, the distortion speed of the piezo-electric element 22 is controlled by changing the frequency of the applied voltage. The liquid droplet ejection using the piezoelectric system has an advantage in that it is unlikely to affect the composition of a material because heat is not applied to the material.

Next, with reference to FIGS. 3A to 5C, a method of forming conductive film wiring on a substrate will be explained as an example of embodiments of the method of forming a wiring pattern according to the present invention. The wiring method for fabricating a pattern according to this embodiment disposes ink for a wiring pattern, mentioned above on a substrate, and forms a conductive film pattern for wiring on the substrate. This is schematically constituted of an HMDS film forming step, a bank forming step, HMDS film patterning step, a residue treatment step (liquid-affinity treatment step), a liquid-repelling treatment step, a material arrangement step, an intermediate drying step, and a heat treatment/light irradiation treatment step.

Hereafter, every step will be explained in detail.

(HMDS Forming Step)

Figure 3A:
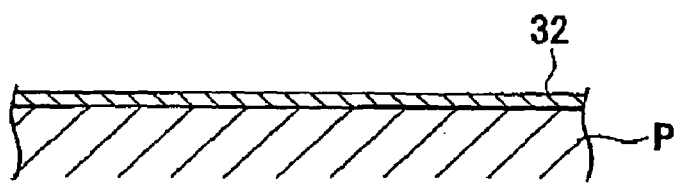
FIGS. 3A to 3C show the procedure of forming a wiring pattern according to a second embodiment of the present invention.

An HMDS (hexamethyldisilazane) film enhances the adhesion between a substrate and a bank, and is formed by, for example, a method (HMDS treatment) of making HMDS steam, and making it adhere to an object. Thereby, as shown in FIG. 3A, an HMDS film 32 is formed on a substrate P.

(Bank Formation Step)

Figure 3B:
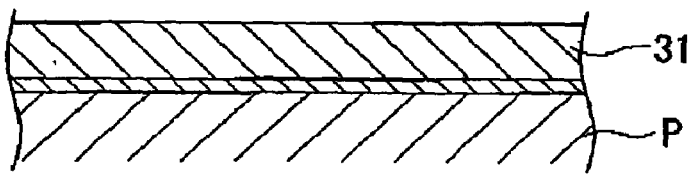

A bank is a member which functions as a partition member, and the formation of the bank can be performed by an arbitrary method such as a lithography method or a printing method. For example, when the lithography method is used, an organic group photosensitive material 31 is applied on the substrate P according to the height of the bank as shown in FIG. 3B by a predetermined method such as spin coating, spray coating, roll coating, dye coating, or dip coating, and a resist layer is applied thereon. Then, the resist coinciding with a bank shape is left by giving a mask coinciding with the bank shape (wiring pattern formation region), and exposing and developing the resist Finally, the bank material in portions except the mask is removed by etching. Alternatively, a bank (convexity) may be formed by two or more layers which are constituted by a lower layer which is made of an inorganic substance or an organic substance that has liquid-affinity to the function liquid, and an upper layer made of an organic substance that has liquid-repellency.

Figure 3C:
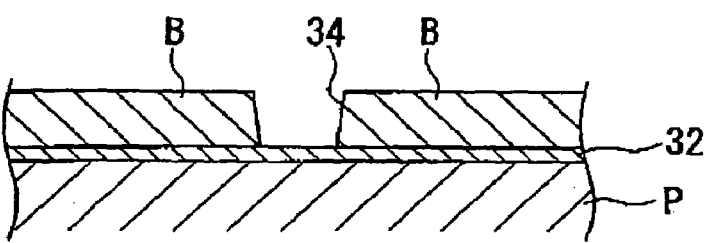

Owing to this, as shown in FIG. 3C, banks B and B are formed so that they may surround the periphery of an area (for example, 10 μm wide) where the wiring pattern should be formed, and an area 34 between the above-described banks is formed.

A material originally exhibiting liquid-repellency to a liquid material may be used as the organic material forming banks, and, as described below, an electrically insulating organic material, which can be made liquid-repelling (Teflon®-ized) by plasma processing, which has sufficient adhesion with a base substrate, and which is easy to be patterned by photolithography, may also be used. For example, it is possible to use a polymeric material such as an acrylic resin, a polyimide resin, an olefin resin, or a melamine resin.

(HMDS Film Patterning Step)

Figure 4A:
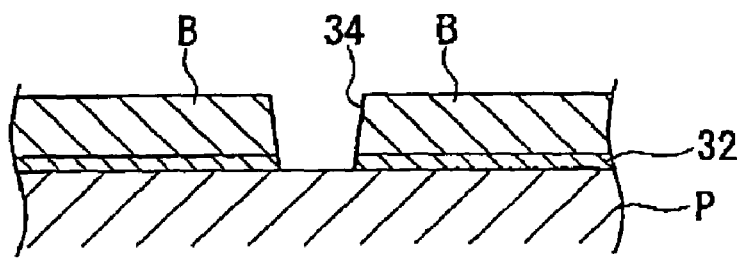
FIGS. 4A to 4C show the procedure of forming a wiring pattern according to a first embodiment of the present invention.

When the banks B are formed on the substrate P, as shown in FIG. 4A, the HMDS film 32 is patterned by etching the HMDS film 32 (base between banks B and B) in the area 34 between banks subsequently. Specifically, the HMDS film is etched by etching the substrate P, on which the banks B are formed, for example, in a 2.5% bydofluoric acid aqueous solution by using the banks B as a masks Owing to this, the substrate P is exposed on the base between the banks B and B.

(Residue Treatment Step (Liquid-affinity Treatment Step))

Next, in order to remove the resist (organic substance) residue between banks 34 at the time of the bank formation, a residue treatment is performed on the substrate P.

As the residue treatment, an ultraviolet ray (UV) irradiation treatment in which residue treatment is performed by irradiating ultraviolet light, an $O_2$ plasma processing in which oxygen is used as a process gas in an ambient air, or the like, may be used, and in this embodiment, the $O_2$ plasma processing is performed here.

Specifically, this is performed by irradiating oxygen plasma from a plasma ignition electrode to the substrate P. As conditions for the $O_2$ plasma processing, for example, plasma power of 50 to 1000 W, an oxygen gas flow of 50 to 100 ml/min, plate transportation speed of the substrate P to a plasma ignition electrode is 0.5 to 10 mm/sec, and substrate temperature is made at 70 to 90° C.

In addition, when the substrate P is a glass substrate, its surface has liquid-affinity to a wiring pattern formation material, but it is possible to increase the liquid-affinity of the substrate P exposed at the bottom between banks 34 by performing the $O_2$ plasma processing or UV irradiation treatment like this embodiment for residue treatment (Liquid-repelling Treatment Step)

Then, liquid-repelling treatment is performed on the banks B and B and liquid-repellency is imparted to their surfaces. As the liquid-repelling treatment, it is possible to adopt a plasma processing method ($CF_4$ plasma processing method) which makes tetrafluoromethane a process gas, for example, in an ambient air. As conditions for the $CF_4$ plasma processing, for example, plasma power of 50 to 1000 W, a tetrafluoromethane gas flow of 50 to 100 ml/min, plate transportation speed of the substrate P to a plasma ignition electrode of 0.5 to 1020 mm/sec, and substrate temperature of 70 to 90° C.

In addition, as the process gas, it is possible to use not only a tetrafluoromethane (carbon tetrafluoride) gas but also fluorocarbon gases.

By performing such a liquid-repelling treatment, a fluorine group is introduced into a resin constituting the banks B, and high liquid-repellency is imparted to the substrate P. In addition, although the $O_2$ plasma processing as a liquid-affinity treatment mentioned above may be performed before the formation of the bank B. Because acrylic resin, polyimide resin, etc. are more easily fluorinated (made to be liquid-repelling) by being subjected to the $O_2$ plasma pre-processing, it is preferable to perform the $O_2$ plasma processing after the formation of the banks B and B.

In addition, a surface of the substrate P which was given the liquid-affinity treatment previously is affected in some degree by the liquid-repelling treatment to the banks B. Nevertheless, in particular, when the substrate P is made of glass and the like, the introduction of the fluorine group by the liquid-repelling treatment does not occur. Hence, the liquid-affinity, i.e., wettability of the substrate P is not substantially spoiled.

Furthermore, the liquid-repelling treatment of the banks B may be omitted when the banks B are formed by a material (for example, a resin material having a fluorine group) which has liquid-repellency.

(Material Arrangement Step)

Next, the ink for a wiring pattern (function liquid) is ejected and disposed on the substrate P exposed in the area 34 between the banks by using the above-described liquid droplet ejecting apparatus IJ. In addition, ink X1 for a wiring pattern which uses chromium as conductive fine particles is ejected here. In addition, conditions for liquid droplet ejection, for example, are that 4 ng/dot of ink weight and 5 to 7 m/sec of ink speed (ejecting speed). In addition, as for the atmosphere for ejecting a liquid droplet, it is preferable to set it at a temperature of 60° C. or lower and a humidity of 80% or lower. Thereby, it is possible to stably perform the liquid droplet ejection without having clogging in the ejecting nozzle of the droplet ejecting head 1.

Figure 4B:
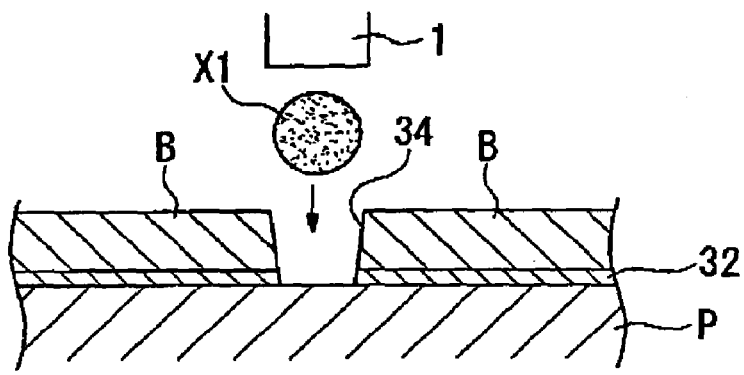

At this material arrangement step, as shown in FIG. 4B, the droplet ejecting head 1 ejects the ink X1 for a wiring pattern as a liquid droplet, the liquid droplet which is disposed on the substrate P which is exposed in the area 34 between the banks.

Figure 4C:
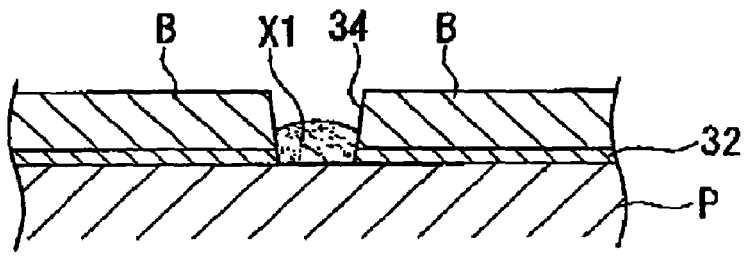

At this time, since the substrate P exposed in the area 34 between the banks is surrounded by the banks B, it is possible to prevent the ink X1 for a wiring pattern from spreading outside a predetermined location. In addition, the surfaces of the Banks B are made liquid-repellent. Hence, even if some ejected ink X1 for a wiring pattern rides on the bank B, the ink X1 is repelled from the bank B and flows down to the area 34 between the banks because the surface of the bank B becomes liquid-repelling. Since the substrate P exposed in the area 34 between the banks is made to have liquid-affinity, it becomes easy for the ejected ink X1 for a wiring pattern to spread on the substrate P exposed in the area 34 between the banks. Hence, as shown in FIG. 4C, it is possible to dispose the ink X1 for a wiring pattern uniformly on the area 34 between the banks in its extending direction.

(Intermediate Drying Step)

After ejecting a predetermined amount of ink X1 for a wiring pattern on the substrate P, drying treatment is performed for the removal of a dispersion medium if necessary. Then, the ink X1 for a wiring pattern is solidified by this drying treatment to the extent of not mixing with another type of ink for a wiring pattern disposed thereon. It is possible to perform this drying treatment also by, for example, lamp annealing instead of a normal treatment by a hot plate, an electric furnace, and the like which heats the substrate P. Although a light source of the light used for the lamp annealing is not limited especially, it is possible to use an infrared lamp, a xenon arc lamp, a YAG laser, an argon laser, a $CO_2$ gas laser, or an excimer laser, using such as one using XeF, XeCl, XeBr, KrF, KrCl, ArF, or ArCl, as a light source. Generally, although light sources having the output range of 10 to 5000 W are used as these light sources, those having the output range of 100 to 1000 W are sufficient in this embodiment.

Figure 5A:
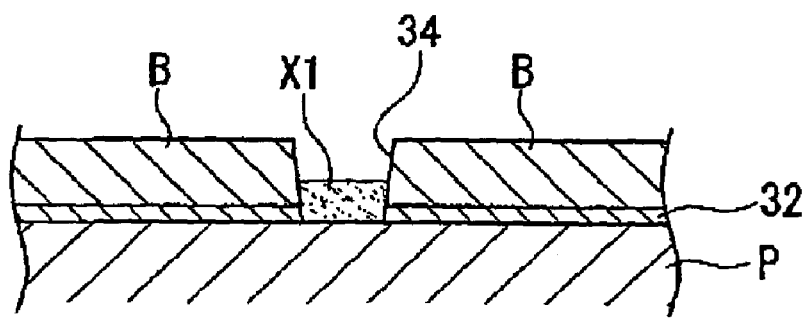
FIGS. 5A to 5C show the procedure of forming a wiring pattern according to the first embodiment of the present invention.

Then, owing to this intermediate drying step, as shown in FIG. 5A, a layer of the ink X1 for a wiring pattern containing chromium as conductive fine particles is formed on the substrate P in the area 34 between the banks.

In addition, when the ink X1 for a wiring pattern does not mix with other types of ink for a wiring pattern even if it the dispersion medium of the ink X1 for a wiring pattern is not removed, the intermediate drying step may be skipped.

In addition, in this intermediate drying step, the ink X1 for a wiring pattern disposed on the substrate P may become a porous body depending on a drying condition. For example, when the 120° C. beating is performed for about 5 minutes, or 180° C. heating is performed for about 60 minutes, the ink X1 for a wiring pattern becomes a porous body. Thus, when the ink X1 for a wiring pattern becomes the porous body, there is a possibility that the ability of a layer of the ink X1 for a wiring pattern will not exhibit a desired function since the function liquid (different metal) disposed on the ink X1 for a wiring pattern enters into the ink X1 for a wiring pattern. For this reason, in this intermediate drying step, it is preferable to perform drying process under a drying condition in which the ink X1 for a wiring pattern does not become a porous body. For example, when the 60° C. heating is performed for about 5 minutes and the 200° C. heating is performed for about 60 minutes, or the 250° C. heating is performed for about 60 minutes, it becomes possible to prevent the ink X1 for a wiring pattern from becoming a porous body.

Then, a wiring pattern formed by stacking different types of ink for a wiring pattern in the area 34 between the banks is formed by disposing ink for a wiring pattern, containing different conductive fine particles, on the ink X1 for a wiring pattern containing chromium as conductive fine particles. In addition, here, ink X2 for a wiring pattern which uses silver as conductive fine particles is disposed on the ink X1 for a wiring pattern.

Figure 5B:
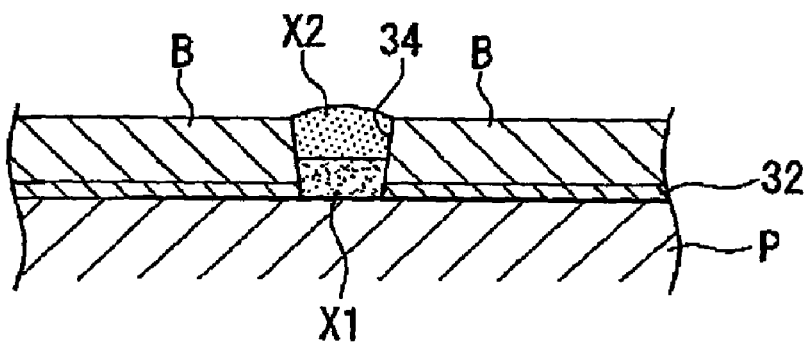

Specifically, by performing the above-described material arrangement step again by using the ink X2 for a wiring pattern, as shown in FIG. 5B, the ink X2 for a wiring pattern is disposed on the ink X1 for a wiring pattern.

Figure 5C:
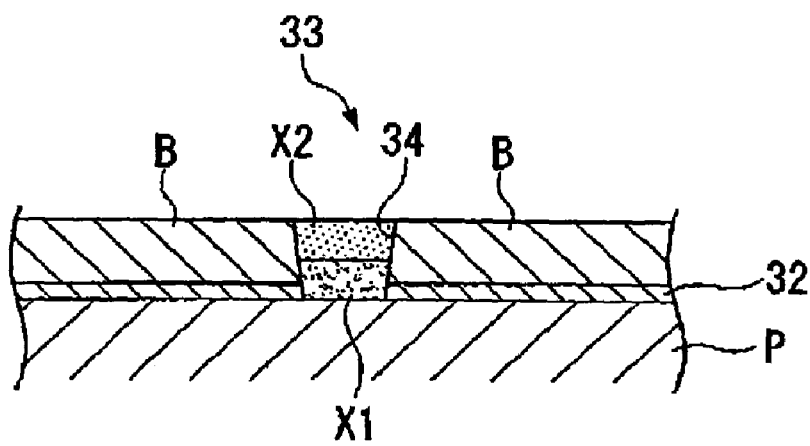

Then, by performing the above-described intermediate drying step again, the dispersion medium of the ink X2 for a wiring pattern is removed, and as shown in FIG. 5C, the wiring pattern 33 is formed by stacking the ink X1 for a wiring pattern and the ink X2 for a wiring pattern in the area 34 between the banks.

The heat treatment/light irradiation treatment step, which will be described below, may be performed without performing the intermediate drying step for removing the dispersion medium of the ink X2 for a wiring pattern.

The liquid-repelling treatment step may be performed again before disposing the ink X2 for a wiring pattern on the ink X1 for a wiring pattern, so that liquid-repellency is imparted to the surfaces of the banks B. Owing to this, it becomes possible to dispose the ink X2 for a wiring pattern securely on the ink X1 for a wiring pattern in the area 34 between the banks, even if the liquid-repellency of the bank B drops because the ink X1 for a wiring pattern contacts the top face of the bank B, etc., when the ink X1 for a wiring pattern is disposed in the area 34 between the banks.

(Heat Treatment/Light Irradiation Treatment)

It is necessary to remove the dispersion medium thoroughly from the dried film after the ejecting step in order to improve electrical contact between fine particles. In addition, if a coating agent such as an organic substance is coated on the surfaces of conductive fine particles in order to enhance dispersibility, it is necessary to also remove this coating material. Therefore, heat treatment and/or light irradiation treatment are performed to the substrate P after the ejecting step.

Although the beat treatment and/or light irradiation treatment are usually performed in air, they can also be performed in the atmosphere of an inert gas such as a nitrogen, argon, or helium gas if necessary. The treatment temperature of the heat treatment and/or light irradiation treatment is suitably determined in consideration of the boiling point (steam pressure) of a dispersion medium, the type and pressure of an atomospheric gas, the thermal behavior of fine particles such as dispersibility and oxidizability, the existence and amount of a coating agent, the heatproof temperature of a base material, and the like.

For example, in order to remove the coating material consisting of an organic substance, it is necessary to bake the substrate at about 300° C. In addition, when a substrate such as a plastic one is used, it is preferable to perform the baking in a range from room temperature to 100° C.

Owing to the above steps, the wiring 33 formed by stacking the chromium and silver is formed in the area 34 between the banks.

In addition, the wiring pattern 33 may be made to have electroconductivity at this heat treatment/light irradiation treatment step by making a function liquid contain nonconductive fine particles but a material which develops electroconductivity by heat treatment or light irradiation treatment.

As explained above, in this embodiment, since the wiring formed by stacking the chromium and silver in the area 34 between the banks is formed, it becomes possible to securely adhere the silver, which bears the main functions as wiring, to the substrate P by the chromium.

In addition, since the surface of the bank B is liquid-repelling as mentioned above, the ink X1 and X2 for a wiring pattern is repelled from the bank B, and flows down to the area 34 between the banks. Nevertheless, when a part of the ink X1 and X2 for a wiring pattern contacts, for example, the top face of the bank B, fine residue may remain on the top face of the bank B. For this reason, for example, when the wiring pattern formed by the method for fabricating a pattern according to this embodiment is used for the gate wiring of a TFT, there is a probability that the channel length of the TFT changes and the inconvenience of leakage current increasing occurs. Then, it is preferable to perform a step of removing the residue on the top face of the bank B after forming the wiring 33 in the area 34 between the banks. Specifically, the residue on the top face of the bank B is removable by shaving off the top face of the bank B by giving wet etching treatment, dry etching treatment, or grinding treatment to the top face of the bank B.

In addition, when the residue on the top face of the bank B is removed, it is preferable to shave off the top face of the bank B so that the top face of the bank B and the top face of the wiring 33 may become the approximately same level. Thus, since the top face of the bank B and the top face of the wiring 33 are approximately flush with each other, it is possible to secure the flatness of an orientation film disposed on the TFT when the wiring pattern formed by, for example, the fabricating method of a pattern according to this embodiment is used for a source wire or a drain wire of the TFT with which a liquid crystal display unit is provided. Hence, it is possible to suppress unevenness occurring in rubbing treatment and the like.

Second Embodiment

As a second embodiment, the wiring 33 having a structure which is different from that in the above-mentioned first embodiment will be explained with reference to FIG. 6. In addition, the second embodiment will be explained while focusing on different portions from the above-mentioned first embodiment.

Figure 6:
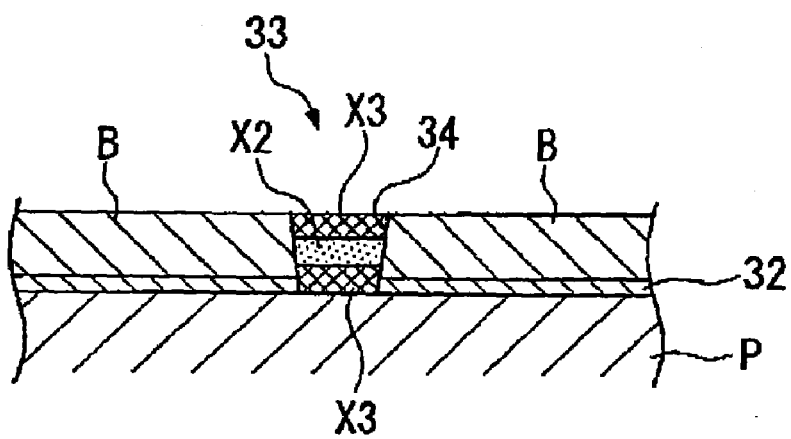
FIG. 6 is a diagram for explaining a second embodiment according to the present invention.

In this second embodiment, as shown in FIG. 6, ink X3 for a wiring pattern, using titanium as conductive fine particles, and the ink X2 for a wiring patter using silver as conductive fine particles are stacked in the area 34 between the banks by repeatedly performing the material arrangement step and intermediate drying step, which are explained in the above-mentioned first embodiment In addition, as illustrated, the ink X3 for a wiring patter, the ink X2 for a wiring pattern, and the ink X3 for a wiring pattern are stacked in the area 34 between the banks in this order from the substrate P. That is, the ink X2 for a wiring pattern is disposed in the area 34 between the banks while being sandwiched by the ink X3 for a wiring patter.

Then, the wiring 33 formed by stacking the titanium, silver, and titanium in this order in the area 34 between the banks is formed by performing the beat treatment/light irradiation treatment step, explained in the above-mentioned first embodiment, on these inks X2 and X3 for a wiring pattern.

The wiring constituted by a stacked layer of titanium and silver has the property that the occurrence of electromigration is delayed in comparison with a silver monolayer. Hence, like this embodiment, by using the wiring 33 formed by sandwiching the silver by the titanium, conductance is ensured and the occurrence of electromigration is delayed. Therefore, according to this embodiment, it becomes possible to obtain the wiring 33 which suppresses the occurrence of electromigration.

As materials which makes the occurrence of electromigration delayed, iron, palladium, platinum, and the like instead of the above-described titanium may be used.

Third Embodiment

As a third embodiment, the wiring 33 having a structure which is different from that of the above-mentioned first and second embodiments will be explained with reference to FIG. 7. In addition, the second embodiment will be explained while focusing on different portions from the above-mentioned first embodiment.

Figure 7:
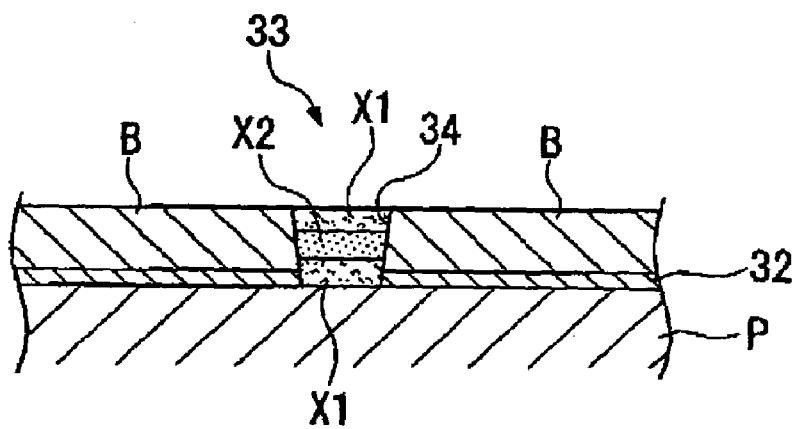
FIG. 7 is a diagram for explaining a third embodiment according to the present invention.

In this third embodiment, as shown in FIG. 7, the ink X1 for a miring pattern, using chromium as conductive fine particles, and the ink X2 for a wiring pattern, using silver as conductive fine particles, are stacked in the area 34 between the banks by repeatedly performing the material arrangement step and intermediate drying step, which are explained in the above-mentioned first embodiment In addition, as illustrated, the ink X1 for a wiring pattern, the ink X2 for a wiring pattern, and the ink X1 for a wiring pattern are stacked in the area 34 between the banks in this order from the substrate P. That is, the ink X2 for a wiring pattern is disposed in the area 34 between the banks while being sandwiched by the ink X1 for a wiring pattern.

Then, the wiring 33 formed by stacking the chromium, silver, and chromium in this order in the area 34 between the banks is formed by performing the heat treatment/light irradiation treatment step, explained in the above-mentioned first embodiment, on these inks X1 and X2 for a wiring pattern.

In regard to the wiring 33 constituted in this manner, it becomes possible not only to improve the adhesion between the silver and substrate P by the layer of the chromium disposed between the silver and substrate P, but also to prevent the oxidation and damage of the silver by the layer of the chromium disposed on the silver.

Therefore, according to this embodiment; it becomes possible to improve adhesion, but also to obtain the wiring 33 having oxidation resistance and scratch resistance.

Fourth Embodiment

As a fourth embodiment, the wiring 33 having a structure which is different from that of the above-mentioned first to third embodiments win be explained with reference to FIG. 5B In addition, the fourth embodiment will be explained while focusing on different portions from the above-mentioned first embodiment.

Figure 8:
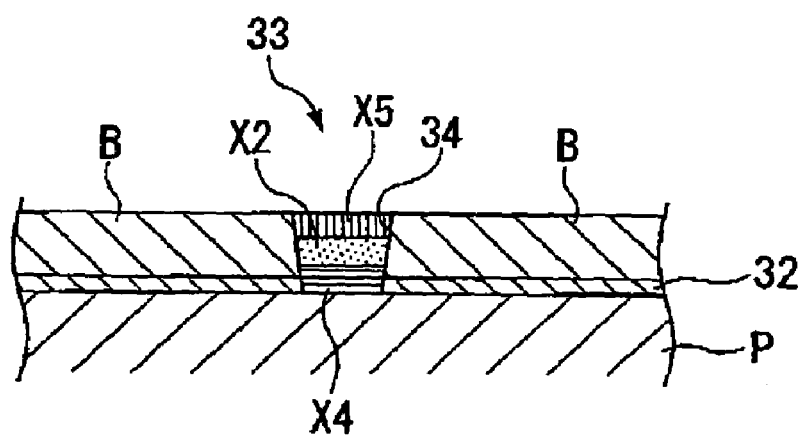
FIG. 8 is a diagram for explaining a fourth embodiment according to the present invention.

In this fourth embodiment as shown in FIG. 8, ink X4 for a wiring pattern, using manganese as conductive fine particles, the ink X2 for a wiring pattern, using silver as conductive fine particles, and ink X5 for a wiring pattern, using nickel as conductive fine particles, are stacked in the area 34 between the banks in this order from the substrate P by repeatedly performing the material arrangement step and intermediate drying step, which are explained in the above-mentioned first embodiment.

Then, the wiring 33 formed by stacking the manganese, silver, and nickel in this order in the area 34 between the banks is formed by performing the heat treatment/light irradiation treatment step, explained in the above-mentioned first embodiment, on these inks X2, X4, and X5 for a wiring pattern.

In the wiring 33 constituted in this manner, the adhesion between the silver and substrate P is improved by the manganese layer disposed between the silver and substrate P. In addition, nickel has a function of suppressing the degradation of silver by plasma irradiation in addition to a function of improving the adhesion of the substrate P and silver. For this reason, it becomes possible to obtain the wiring 33 which can suppress the degradation of the silver by disposing the nickel on the silver when performing plasma irradiation to the substrate P on which the wiring 33 is formed.

Fifth Embodiment

Next, a fifth embodiment of a method for fabricating a pattern according to the present invention will be explained. The method for fabricating a pattern according to this embodiment locates ink for a wiring pattern, mentioned above, on the substrate P, and forms a conductive film pattern for wiring on the substrate P. This is schematically constituted by a surface treatment step, a material arrangement step, intermediate drying step, and a heat treatment/light irradiation treatment step.

Hereafter, every step will be explained in detail.

(Surface Treatment Step)

The surface treatment step is substantially classified into a liquid-repelling treatment step in which a surface of a substrate P is made liquid-repelling, and the liquid-affinity treatment step in which the surface of the substrate P, having been made liquid-repelling, is made to have liquid-repellency in accordance with the wiring pattern forming region.

At the liquid-repelling treatment step, the surface of the substrate P on which conductive film wiring will be formed is processed to be repellent to a liquid material. Specifically, the surface treatment is performed on the surface of the substrate P so that the difference between a predetermined contact angle to ink for a wiring pattern containing conductive fine particles and a contact angle in a liquid-affinity section (function liquid application region) H1 (explained in fill detail below) may preferably become 50° or larger.

As a method of reforming the surface of the substrate P to be liquid-repelling, for example, a method of forming a self-organizing film on the surface of the substrate P, a plasma processing method, or the like can be adopted.

In a self-organizing film fabricating method, a self-organizing film consisting of an organic molecular film and the like is formed on the surface of the substrate P on which conductive film wiring should be formed.

An organic molecular film for treating a substrate P surface includes functional groups bondable with a substrate P, a functional group of reforming the surface nature of a substrate (controlling surface energy) such as a lyophilic group or a liquid-repelling group, in its opposite side, and a carbon straight chain or a partially branched carbon chain for connecting these functional groups. This material bonds with the substrate P, self-organizes, and forms a molecular film such as a monomolecular film.

Here, this self-organizing film includes a bonding functional group which can react with atoms constituting the base layer of a substrate, and other straight chain molecules, which is formed by orienting a compound which has an extremely high orientation characteristic due to the interaction of the straight chain molecules. Since this self-organizing film is made of oriented monomolecules, film thickness can be extremely thin, and is uniform at the molecular level. That is, since molecules with the same structures are positioned on the surface of the film, uniform and excellent lyophilic and repellency characteristics can be given to the surface of the film.

If a fluoroalkylsilane, for example, is used as the compound having a high orientation characteristics, the self-organizing film is formed by each compound being oriented such that the fluoroalkyl group positions on the surface of the film, so that uniform repellency can be imparted to the surface of the film.

Compounds for forming such a self-organizing film are fluoroalkylsilane hereafter, "FAS") such as heptadecafluoro-1,1,2,2 tetrahydrodesyltriethoxysilane, heptadecafluoro-1,1, 2,2 tetrahydrodesyltrimethoxysilane, heptadecafluoro-1,1, 2,2 tetrahydrodesyltrichlorosilane, tridecafluoro-1,1,2,2 tetahydrooctyltriethoxysilane, tridecafluoro-1,1,2,2 tetrahydrooctyltrimethoxysilane, tridecafluoro-1,1,2,2 tetrahydrooctyltrichlorosilane and trifluoropropyltrimethoxysilane. For use, it is preferable to use one compound, but two or more types of compounds may be combined. In addition, it is possible to obtain adhesion with the substrate P and good repellency by using the FAS.

The FAS is generally expressed by a constitutional formula $RnSiX_{(4-n)}$. Here n is an integer between 1 and 3 inclusive, X is a hydrolytic group such as a methoxy group, ethoxy group, or halogen atoms. In addition, R is a fluoroalkyl group, which has the structure $(CF_3)(CF_2)_x(CH_2)_y$ (where x is an integer between 0 and 10 inclusive, y is an integer between 0 and 4 inclusive), and if a plurality of groups R or X are combined with Si, then all the groups R or X may be the same or different The hydrolytic group expressed by X forms silanol by hydrolysis, and bonds with the substrate P by siloxane bonding with reacting with the hydroxyl group in the base layer of the substrate P (glass, silicon). On the other hand, R has a fluoro group such as ($CF_2$) on the surface, which reforms the base layer surface of the substrate P into a surface which is difficult to wet (surface energy is low).

The self-organizing film including an organic molecular film is formed on the substrate P when the above-mentioned raw material compound and the substrate P are set in the same sealed container and left for 2 to 3 days at room temperature. In addition, when the entire sealed container is held at 100° C., the self-organizing film is formed on the substrate P in about three hours. This is a method of forming a self-organizing film from a vapor phase; however, a self-organizing film can be formed from a liquid phase as well. For example, when the substrate P is dipped into a solution containing the raw material compound, and is cleaned and dried, the self-organizing film is generated on the substrate P.

In addition, it is desirable to perform pretreatment on the surface of the substrate P by irradiating ultraviolet light on the substrate P, or cleaning it by using a solvent before forming the self-organizing film.

On the other hand, in the plasma processing method, plasma irradiation is performed on the substrate P at ordinary pressure or in a vacuum. Types of gases used for the plasma processing can be variously selected in consideration of the surface material of the substrate P, on which a wiring pattern should be formed, and the like. As process gases, for example, tetrafluoromethane, perfluorohexane, perfluorodecane, and the like can be exemplified.

In addition, the treatment for making the surface of the substrate P liquid-repellent may be performed by adhering a film such as a polyimide film, which has been treated with tetrafluoroethylene so as to have desired liquid-repellency, to the surface of the substrate P. In addition, a polyimide film, which has high liquid-repellency, may be used as the substrate P.

Figure 9A:
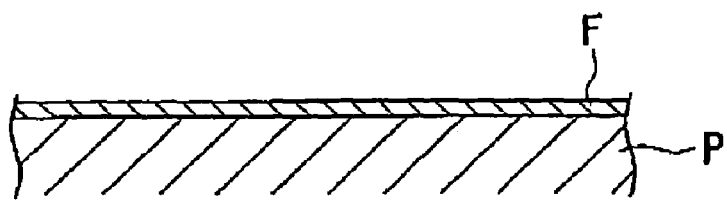
FIGS. 9A to 9C are diagrams showing the procedure of forming a wiring pattern of a fifth embodiment according to the present invention.

Thus, by performing the self-organizing film fabricating method and plasma processing method, as shown in FIG. 9A, a liquid-repelling film F is formed on the surface of the substrate P.

Next, a liquid-affinity section H1 is formed by reducing the liquid-repellency of an area where ink for a wiring pattern is applied and a wiring pattern should be formed, and imparting liquid-affinity (liquid-affinity treatment).

Hereafter, the liquid-affinity treatment will be explained

Figure 9B:
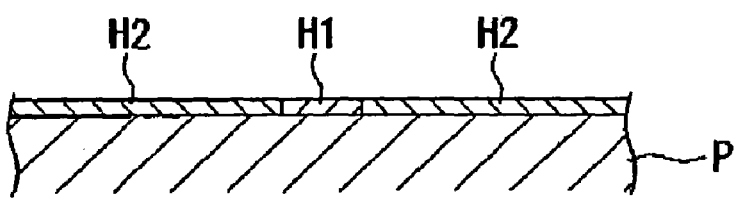

A method of irradiating ultraviolet light at a wavelength of 170 to 400 nm can be used for the liquid-affinity treatment. At this time, by irradiating ultraviolet light by using a mask for a wiring pattern, it is possible to selectively reform only a wiring pattern forming region in the once-formed liquid-repelling film F, to reduce its liquid-repellency, and reform the part to be lyophilic. That is, by performing the above-mentioned liquid-repelling treatment and liquid-affinity treatment, as shown in FIG. 9B, the liquid-affinity section H1 to which liquid-affinity is imparted, and a liquid-repelling section (liquid-repelling area) H2 constituted of a liquid-repelling film F surrounding the liquid-affinity section H1 are formed in a location, in which a wiring pattern should be formed, on the substrate P.

In addition, although it is possible to adjust the extent of reduction of liquid-repellency by the irradiation period of ultraviolet light, it is also possible to adjust the extent by the combination of intensity and wavelength of ultraviolet light, and heat treatment (heating), and the like.

As other methods of the liquid-affinity treatment, the plasma processing in which oxygen is used as a reactive gas may be used. Specifically, it is performed by irradiating oxygen plasma from a plasma discharge electrode to the substrate P. As conditions for $O_2$ plasma processing, for example, plasma power is 50 to 1000 W, an oxygen gas flow rate is 50 to 100 ml/min, the plate transportation speed of the substrate P to the plasma discharge electrode is 0.5 to 10 mm/sec, and substrate temperature is 70 to 90° C.

In addition, a contact angle of the liquid-affinity section H1 to the ink for a wiring pattern containing conductive fine particles is preferably set at 10° or less by adjusting the plasma processing conditions, for example, lengthening plasma processing time by making the transportation speed of the substrate P slow.

Furthermore, as another liquid-affinity treatment, it is also possible to adopt the treatment of exposing a substrate to an ozone atmosphere.

(Material Arrangement Step)

Next, the ink for a wiring pattern (function liquid) is ejected and disposed on the liquid-repelling section H1 by using the above-described liquid droplet ejecting apparatus IJ. In addition, the ink X1 for a wiring pattern which uses chromium as conductive fine particles is ejected here. In addition, conditions for liquid droplet ejection, for example, are at 4 ng/dot of ink weight and 5 to 7 m/sec of ink speed (ejecting speed). In addition, as for the atmosphere for ejecting a liquid droplet, it is preferable to set it at a temperature of 60° C. or lower and a humidity of 80% or lower. It is thereby possible to stably perform the liquid droplet ejection without having clogging in the ejecting nozzle of the droplet ejecting head 1.

Figure 9C:
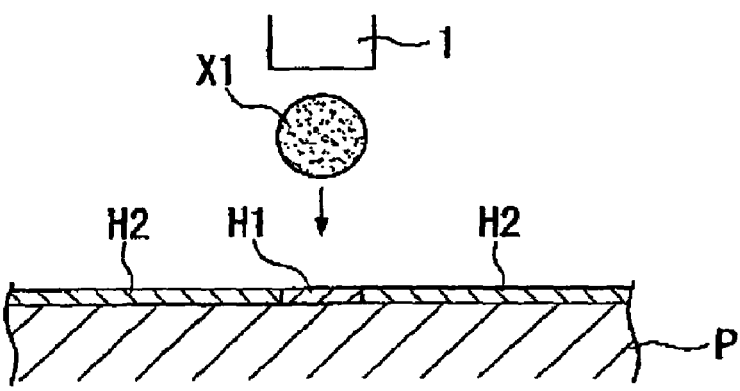

At this material arrangement step, as shown in FIG. 9C, the droplet ejecting head 1 ejects the ink X1 for a wiring pattern in a liquid droplet, the liquid droplet which is disposed on the liquid-repelling section H1.

Figure 10A:
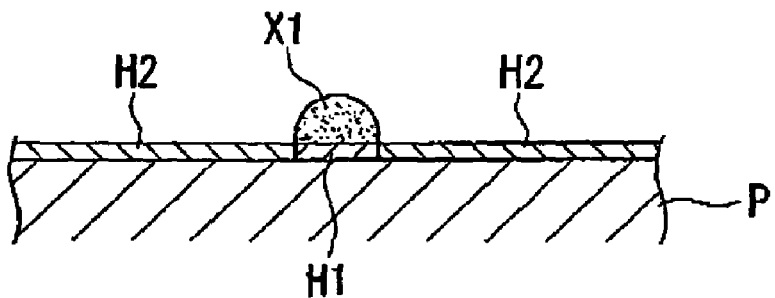
FIGS. 10A to 10D are diagrams showing the procedure of forming a wiring pattern of a fifth embodiment according to the present invention.

At this time, since liquid-repellency is imparted to the liquid-repelling section H2, even if a part of the ink X1 for a wiring pattern rides on the liquid-repelling section H2, it is repelled from the liquid-repelling section 142, and as shown in FIG. 10A, it collects in the liquid-affinity section H1 between the liquid-repelling areas H2. In addition, since the liquid-affinity section H1 is made to have liquid-affinity, the ejected ink X1 for a wiring pattern becomes easier to spread in the liquid-affinity section H1. Hence, the ink X1 for a wiring pattern can fill the liquid-affinity section H1 within a predetermined position uniformly without being divided.

(Intermediate Drying Step)

After ejecting a predetermined amount of the ink X1 for a wiring pattern on the liquid-affinity section H1, a drying treatment is performed for the removal of a dispersion medium if necessary. Then, the ink X1 for a wiring pattern is solidified by this drying treatment to the extent of not mixing with another type of ink for a wiring pattern disposed thereon. It is also possible to perform this drying treatment by, for example, lamp annealing, instead of a normal treatment by a hot plate, an electric furnace, and the like which beats the substrate P. Although a light source of the light used for the lamp annealing is not limited especially, it is possible to use an infrared lamp, a xenon arc lamp, a YAG laser, an argon laser, a $CO_2$ gas laser, or an excimer laser, using such as one using XeF, XeCl, XeBr, KrF, KrCl, ArF, or ArCl, as a light source. Generally, although light sources having the output range of 10 to 5000 W are used as these light sources, those having the output range of 100 to 1000 W are sufficient in this embodiment.

Figure 10B:
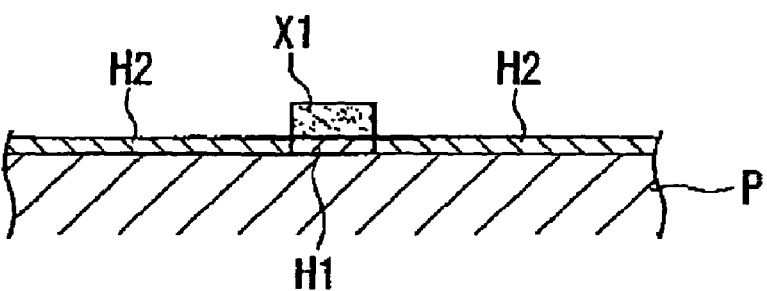

Then, owing to this intermediate drying step, as shown in FIG. 10B, a layer of the ink X1 for a wiring pattern containing chromium as conductive fine particles is formed on the liquid-affinity section H1.

In addition, when the ink X1 for a wiring pattern does not mix with other types of ink for a wiring pattern even if the dispersion medium of the ink X1 for a wiring pattern is not removed, the intermediate drying step may be skipped.

In addition, in this intermediate drying step, it is preferable to perform a drying process under a drying condition in which the ink X1 for a wiring pattern does not become a porous body.

Then, a wiring pattern formed by stacking different types of ink for a wiring pattern in the liquid-affinity section H1 is formed by disposing ink for a wiring pattern, containing different conductive fine particles, on the ink X1 for a wiring pattern containing chromium as conductive fine particles. In addition, here the ink X2 for a wiring pattern which uses silver as conductive fine particles is disposed on the ink X1 for a wiring pattern.

Figure 10C:
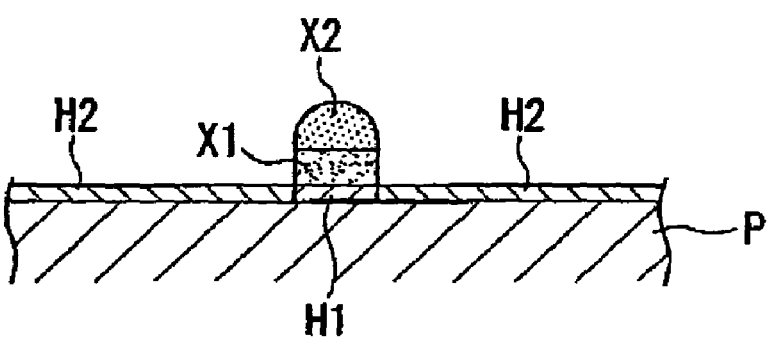

Specifically, by performing the above-described material arrangement step again by using the ink X2 for a wiring pattern, as shown in FIG. 10C, the ink X2 for a wiring pattern is disposed on the ink X1 for a wiring pattern.

Figure 10D:
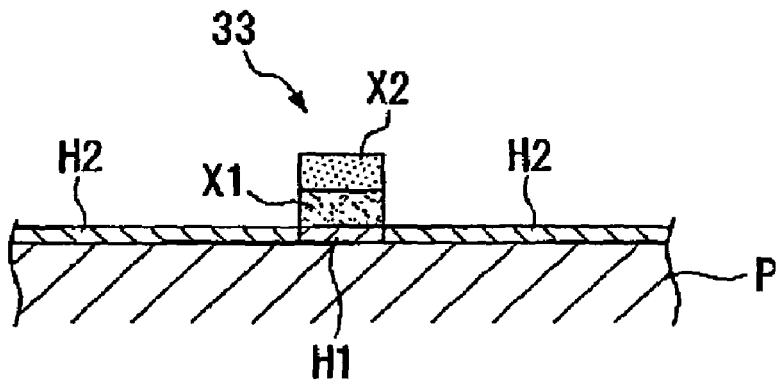

Then, by performing the above-described intermediate drying step again, the dispersion medium of the ink X2 for a wiring pattern is removed, and as shown in FIG. 10D, the wiring pattern 33 is formed, which includes the ink X1 for a wiring pattern and the ink X2 for a wiring pattern stacked on the liquid-affinity section H1.

The heat treatment/light irradiation treatment step, which will be described below, may be performed without performing the intermediate drying step for removing the dispersion medium of the ink X2 for a wiring pattern.

In addition, the liquid-repelling treatment step may be performed again on the liquid-repelling section H2 before disposing the ink X2 for a wiring pattern on the ink X1 for a wiring pattern. Owing to this, it becomes possible to dispose the ink X2 for a wiring pattern securely on the ink X1 for a wiring pattern in the liquid-affinity section H1, even if the liquid-repellency of the liquid-repelling section H2 drops because the ink X1 for a wiring pattern contacts the liquid-repelling section H2 when the ink X1 for a wiring pattern is disposed in the liquid-affinity section H1.

(Heat Treatment/Light Irradiation Treatment Step)

It is necessary to remove the dispersion medium thoroughly from the dried film after the ejecting step in order to improve electrical contact between fine particles. In addition, if a coating agent such as an organic substance is coated on the surfaces of conductive fine particles in order to enhance dispersibility, it is necessary to also remove this coating agent. Therefore, heat treatment and/or light irradiation treatment are performed to the substrate P after the ejecting step.

Although the heat treatment and/or light irradiation treatment are usually performed in air, they may also be performed in an atmosphere of an inert gas such as nitrogen, argon, or helium gas, if necessary. The treatment temperature of the heat treatment and/or light irradiation treatment is suitably determined in consideration of the boiling point (steam pressure) of a dispersion medium, the type and pressure of an atmospheric gas, the heat behavior of fine particles such as dispersibility and oxidizability, the existence and amount of a coating agent, the heatproof temperature of a base material, and the like.

For example, in order to remove the coating agent consisting of an organic substance, it is necessary to bake the substrate at about 300° C. In addition, when a substrate such as one of plastic one is used, it is preferable to perform the baking in a range from room temperature to 100° C.

Owing to the above steps, the wiring 33 formed by stacking the chromium and silver is formed in the liquid-affinity section H1.

In addition, the wiring pattern 33 may be made to have electroconductivity at this heat treatment/light irradiation treatment step by making a function liquid contain non-conductive fine particles but a material which develops electroconductivity by heat treatment or light irradiation treatment.

As explained above, in this embodiment, since the wiring formed by stacking the chromium and silver in the liquid-affinity section H1 is formed, it becomes possible to securely adhere the silver, which bears the main functions as wiring, to the substrate P by the chromium.

In addition, similarly to the bank B shown in the above-mentioned first embodiment, when a part of the ink X1 and X2 for a wiring pattern touches, for example, the liquid-repelling section H2, fine residue may remain in the liquid-repelling section H2. Then, it is preferable to perform a step of removing the residue on the liquid-repelling section H2 after forming the wiring 33 in the liquid-affinity section H1. Specifically, the residue on the liquid-repelling section H2 is removable with $O_2$ ashing treatment and UV irradiation treatment.

Sixth Embodiment

As a sixth embodiment, the wiring 33 having a structure which is different from that of the above-mentioned fifth embodiment will be explained with reference to FIG. 11. In addition, the sixth embodiment will be explained while focusing on different portions from the above-mentioned fifth embodiment.

Figure 11:
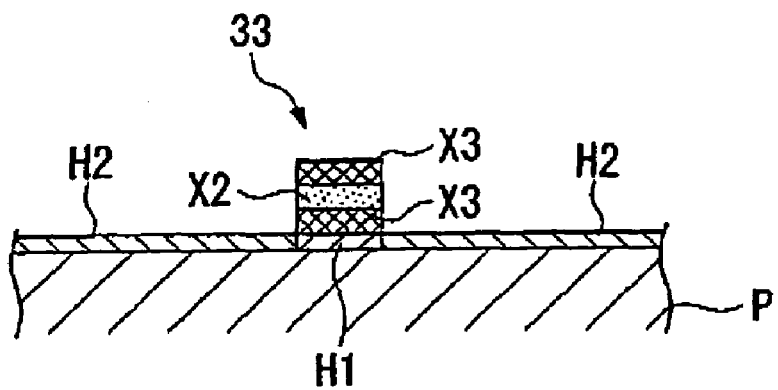
FIG. 11 is a diagram for explaining a sixth embodiment according to the present invention.

In this sixth embodiment, as shown in FIG. 11, the ink X3 for a wiring pattern, using titanium as conductive fine particles, and the ink X2 for a wiring pattern, using silver as conductive fine particles, are stacked in the liquid-affinity section H1 by repeatedly performing the material arrangement step and intermediate drying step, which are explained in the above-mentioned fifth embodiment. In addition, as illustrated, the ink X3 for a wiring pattern, the ink X2 for a wiring pattern, and the ink X3 for a wiring pattern are stacked above the liquid-affinity section H1 in this order from the substrate P. That is, the ink X2 for a wiring pattern is disposed on the liquid-affinity section H1 while being sandwiched by the ink X3 for a wiring pattern.

Then, the wiring 33 formed by stacking the titanium, silver, and titanium in this order on the liquid-affinity section H1 is formed by performing the beat treatment/light irradiation treatment step, explained in the above-mentioned fifth embodiment, on these inks X2 and X3 for a wiring pattern.

The wiring constituted by a stacked layer of the titanium and silver has the property that the occurrence of electromigration is delayed in comparison with a silver monolayer. Hence, by using the wiring 33 formed by sandwiching the silver by the titanium, conductance is ensured and the occurrence of electromigration is delayed. Therefore, according to this embodiment, it becomes possible to obtain the wiring 33 which suppresses the occurrence of electromigration.

In addition, as materials which delay the occurrence of electromigration, iron, palladium, platinum, and the like instead of the above-described titanium may be used.

Seventh Embodiment

As a seventh embodiment, the wiring having a structure which is different from that of the above-mentioned fifth and sixth embodiments will be explained with reference to FIG. 12. In addition, the seventh embodiment will be explained while focusing on different portions from the above-mentioned fifth embodiment.

Figure 12:
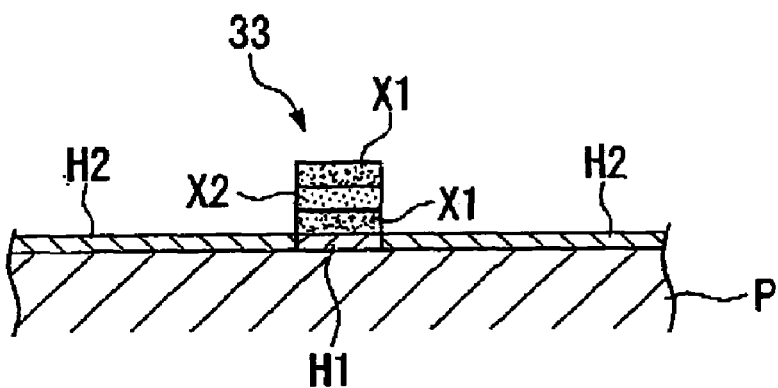
FIG. 12 is a diagram for explaining a seventh embodiment according to the present invention.

In this seventh embodiment, as shown in FIG. 12, the ink X1 for a wiring pattern, using chromium as conductive fine particles, and the ink X2 for a wiring pattern, using silver as conductive fine particles, are stacked on the liquid-affinity section H1 by repeatedly performing the material arrangement step and intermediate drying step, which are explained in the above-mentioned fifth embodiment. In addition, as illustrated, the ink X1 for a wiring pattern, the ink X2 for a wiring pattern, and the ink X1 for a wiring pattern are stacked on the liquid-affinity section H1 in this order from the substrate P. That is, the ink X2 for a wiring pattern is disposed above the liquid-affinity section H1 while being sandwiched by the ink X1 for a wiring pattern.

Then, the wiring 33 formed by stacking the chromium, silver, and chromium in this order on the liquid-affinity section H1 is formed by performing the heat treatment/light irradiation treatment step, explained in the above-mentioned fifth embodiment, on these inks X1 and X2 for a wiring patter In regard to the wiring 33 constituted in this manner, it becomes possible not only to improve the adhesion between the silver and substrate P by the layer of the chromium disposed between the silver and substrate P, but also to prevent the oxidation and damage of the silver by the layer of the chromium disposed on the silver. Therefore, according to this embodiment, it not only becomes possible to improve adhesion, but also to obtain the wiring 33 having oxidation resistance and scratch resistance.

Eighth Embodiment

As an eighth embodiment, the wiring 33 having a structure which is different from that of the above-mentioned fifth to seventh embodiments will be explained with reference to FIG. 13. In addition, the eighth embodiment will be explained while focusing on different portions from the above-mentioned fifth embodiment.

Figure 13:
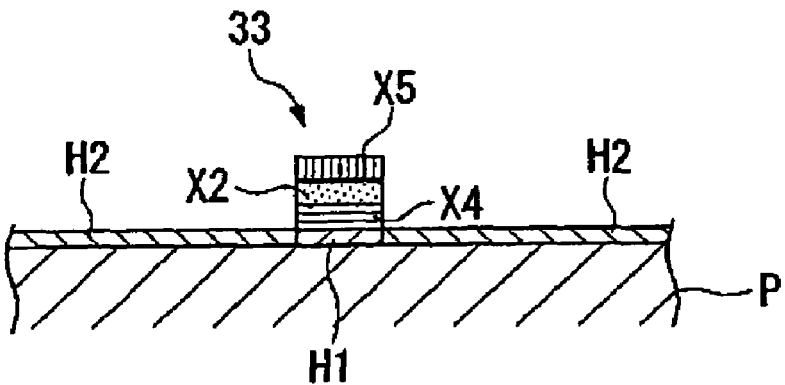
FIG. 13 is a diagram for explaining an eight embodiment according to the present invention.

In this eighth embodiment, as shown in FIG. 13, the ink X4 for a wiring pattern, using manganese as conductive fine particles, the ink X2 for a wiring pattern, using silver as conductive fine particles, and the ink X5 for a wiring patter, using nickel as conductive fine particles are stacked on the liquid-affinity section H1 in this order from the substrate P by repeatedly performing the material arrangement step and intermediate drying step, which are explained in the above-mentioned fifth embodiments.

Then, the wiring 33 formed by stacking the manganese, silver, and nickel in this order on the liquid-affinity section H1 is formed by performing the heat treatment/light irradiation treatment step, explained in the above-mentioned fifth embodiment, on these inks X2, X4, and X5 for a wiring pattern.

In the wiring 33 constituted in this manner, the adhesion between the silver and substrate P is improved by the manganese layer disposed between the silver and substrate P. In addition, nickel has a function of suppressing the degradation of silver by plasma irradiation in addition to a function of improving the adhesion between the substrate P and silver. For this reason, it becomes possible to obtain the wiring 33 which can suppress the degradation of the silver by disposing the nickel on the silver when performing plasma irradiation to the substrate P on which the wiring 33 is formed.

Ninth Embodiment

Figure 14:
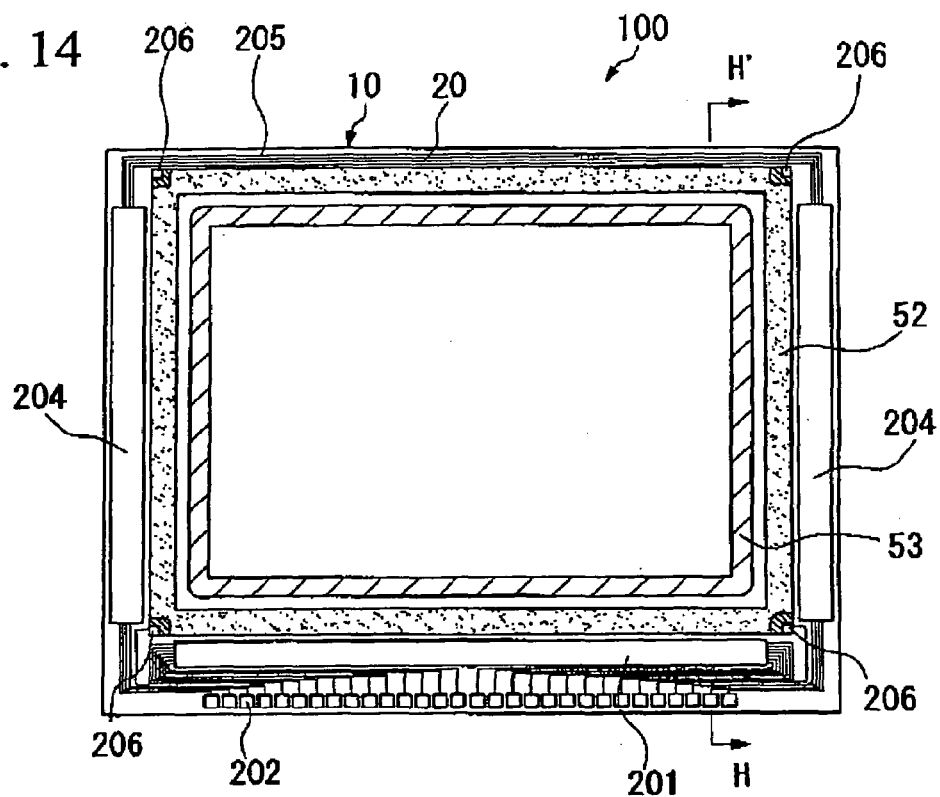
FIG. 14 is a plan view of a liquid crystal display device as viewed from an opposing substrate side.
Figure 15:
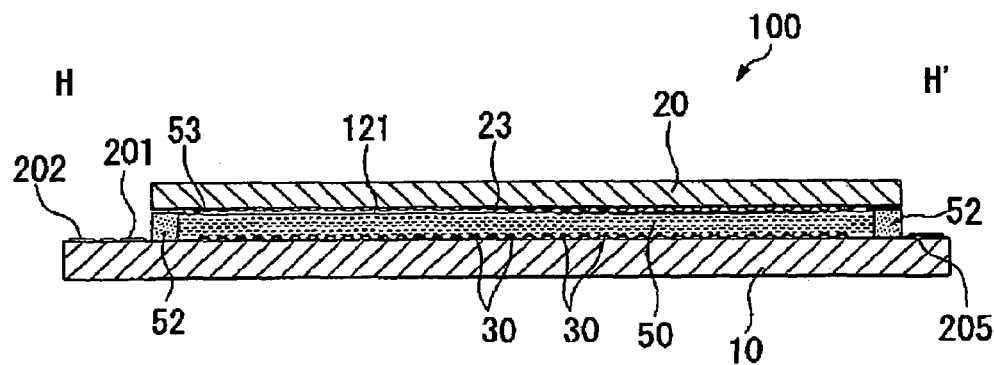
FIG. 15 is a sectional view taken along the line H—H in FIG. 14.
Figure 16:
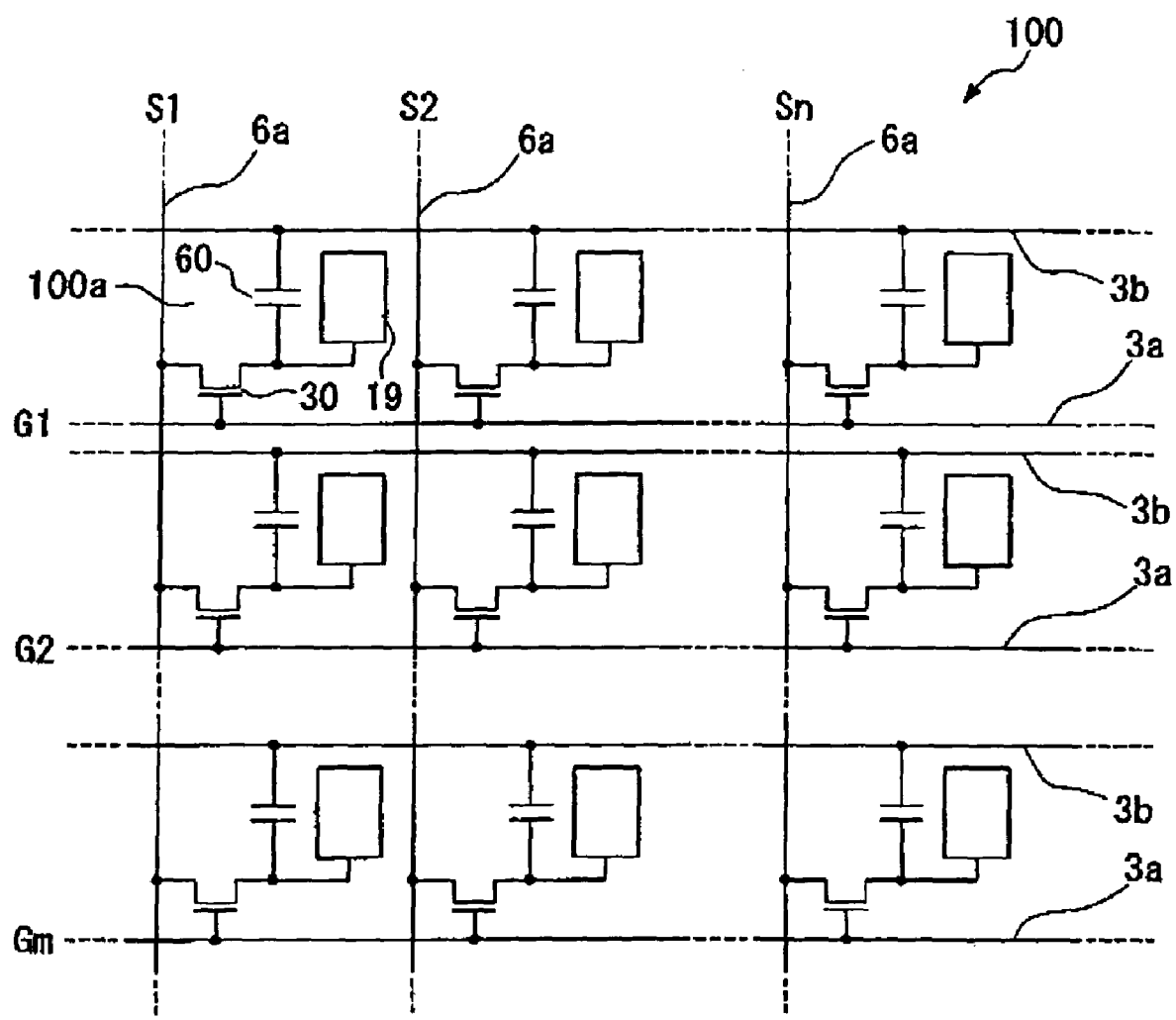
FIG. 16 is an equivalent circuit diagram of the liquid crystal display device.
Figure 17:
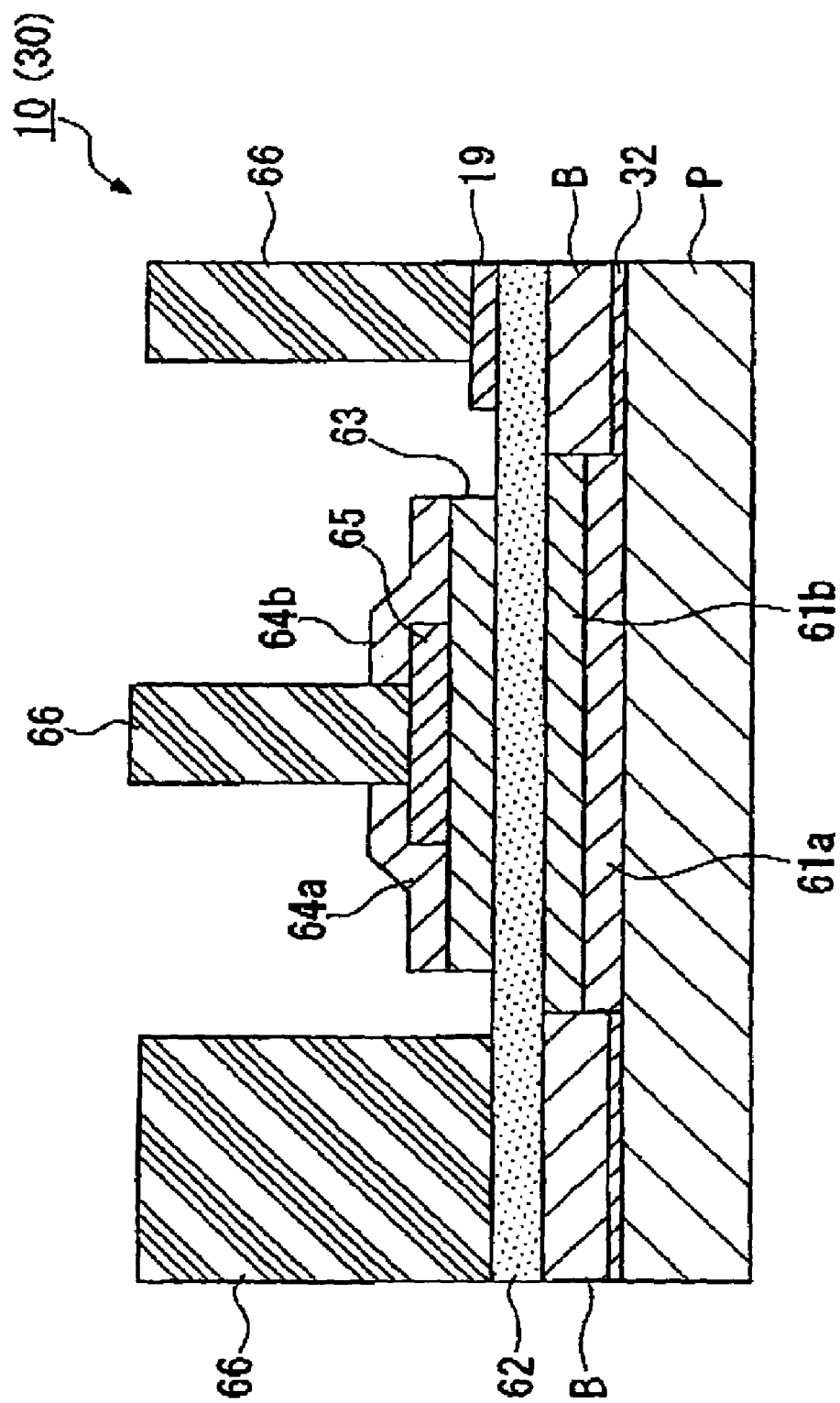
FIG. 17 is a partially enlarged sectional view of the liquid crystal display unit.

As a ninth embodiment, a liquid crystal display unit is an example of the electro-optical apparatus of the present invention. FIG. 14 is a plan view showing each component of the liquid crystal display unit according to the present invention as viewed from an opposing substrate side. FIG. 15 is a sectional view taken along the line H—H in FIG. 14. FIG. 16 shows equivalent circuit diagrams such as various devices and wiring in a plurality of pixels formed in a matrix form in the image display region of the liquid crystal display unit. FIG. 17 is the partially enlarged sectional view of the liquid crystal display unit.

In FIGS. 14 and 15, in the liquid crystal display unit (electro-optical apparatus) 100 of this embodiment, a TFT array substrate 10 and an opposing substrate 20, which make a pair, are adhered with a sealant 52 which is a photo-curing sealing agent. Liquid crystal 50 is enclosed and held in a region partitioned by this sealant 52. The sealant 52 is formed in the shape of a frame which is closed in a region within the substrate surface.

A peripheral parting 53 which consists of a light blocking material is formed in the interior region of the formation region of the sealant 52. In the outer region of the sealant 52, a data line driving circuit 201 and the mounting terminal 202 are formed along one side of the TFT array substrate 10, and a scanning line driving circuit 204 is formed along two sides adjacent to this one side. A plurality of wiring 205 for connecting between the scanning line driving circuits 204 provided in both sides of the image display region is provided in the residual one side of the TFT array substrate 10. In addition, in at least one location of corner sections of the opposing substrate 20, an inter-substrate conductive material 206 for electrically connecting between the TFT array substrate 10 and opposing substrate 20 is arranged.

In addition, instead of forming the data line driving circuit 201 and scanning line driving circuit 204 on the TFT array substrate 10, for example, it is also sufficient to electrically and mechanically connect a TAB (Tape Automated Bonding) substrate, in which a driving LSI is mounted, with a terminal block, formed in the peripheral part of the TFT array substrate 10, via an anisotropic conductive film. In addition, in a liquid crystal display device 100, a phase difference plate, a polarizing plate, etc., are disposed in a predetermined direction according to the type of the liquid crystal 50 to be used, i.e., the kind of modes of operation such as a TN (Twisted Nematic) mode, a C-TN method, a VA system, and an IPS system, and a normally white mode/normally black mode; however, illustration thereof is omitted here. In addition, in the case of constituting the liquid crystal display device 100 for color display, in the opposing substrate 20, color filters of, for example, red (R), green (G), and blue (B) are formed with overcoat in regions which face respective pixel electrodes of the TFT array substrate 10 described below.

In the image display region of the liquid crystal display device 100 having such a structure, as shown in FIG. 16, while a plurality of pixels 100a is constituted in a matrix form a TFT 30 for pixel switching (switching device) is formed in each of these pixels 100a. Data lines 6a which supply pixel signals S1, S2, . . . , Sn are electrically connected to sources of TFTs 30. The pixel signals S1, S2, ..., Sn written in the data lines 6a may be supplied line by line in this order, or may be supplied group by group which is constituted by a plurality of adjacent data lines 6a. In addition, scanning lines 3a are electrically connected to the gates of TFTs 30, and are constituted so that scanning signals G1, G2, ..., Gm may be applied to the scanning lines 3a line by line in this order at a predetermined timing in a pulse mode.

Each pixel electrode 19 is electrically connected to a drain of each TFT 30, and makes the TFT 30, which is a switching device, turn on only for a fixed period to write each of the pixel signals S1, S2, ..., Sn supplied from the data lines 6a in each pixel in predetermined tuning. Thus, the pixel signals S1, S2, ..., Sn in predetermined level which are written in the liquid crystals via the pixel electrodes 19 are held for a fixed period between the opposing electrodes 121 of the opposing substrate 20 shown in FIG. 15. In addition, in order to prevent the held pixel signals S1, S2, ..., Sn from leaking, storage capacitors 60 are added in parallel to liquid crystal capacitors, which each are formed between the pixel electrode 19 and opposing electrode 121. For example, the voltage of the pixel electrode 19 can be held by the accumulating capacitance 60 by a time period that is hundreds of times longer than the interval that the source voltage is applied. Thereby, the holding property of electric charges is improved and it is possible to produce the liquid crystal display device 100 with a high contrast ratio.

FIG. 17 is a partially enlarged sectional view of a liquid crystal display unit 100 which has bottom gate TFTs 30, and gate wiring 61 formed by stacking a plurality of different materials formed by the method for fabricating a pattern of the above-mentioned embodiment is formed on a glass substrate P which constitutes a TFT array substrate 10. In addition, in this embodiment, since the substrate P is heated up to about 350° C. in the process of forming an amorphous silicon layer, described below, when forming the gate wiring 61, an inorganic bank material is used as a material which can withstand the temperature. In addition, in this embodiment, the gate wiring 61 formed by stacking chromium 61a and silver 61b is shown as an example.

On the gate wiring 61, a semiconductor layer 63, constituted of an amorphous silicon (a-Si) layer, is stacked through a gate insulating film 62 constituted of $SiN_x$. A portion of the semiconductor layer 63 which faces this gate wiring portion is made a channel region. On the semiconductor layer 63, the connecting layers 64a and 64b which each are constituted of an n$^+$ type a-Si layer for obtaining an ohmic junction are stacked, and an insulating etch stop film 65 constituted of $SiN_x$ for protecting a channel is formed on the semiconductor layer 63 in the center section of the channel region. In addition, these gate insulating film 62, semiconductor layer 63, and etch stop film 65 are patterned, as illustrated, by being given resist coating, exposure and development and photoetching after vaporization (CVD).

Furthermore, the connecting layers 64a and 64b and a pixel electrode 19 constituted of ITO are patterned, as illustrated, by giving photoetching while being also formed similarly as films. Then, banks 66 ... are formed respectively on the pixel electrode 19, gate insulating film 62, and etch stop film 65, and a source wire and a drain wire are formed between these banks 66 ... by using the liquid droplet ejecting apparatus IJ mentioned above. In addition, these source wires and drain wires can be also constituted as a pattern according to the present invention.

Therefore, in this embodiment, it is possible to form the gate wire 61, source wire, and drain wire as wiring formed by stacking a plurality of different materials, and to obtain the gate wire 61, source wire, and drain win which have a plurality of functionalities.

In addition, when his wiring is constituted by two layers of chromium and silver which are explained in the above-mentioned first embodiment, it is possible to obtain the liquid crystal display unit 100 where the adhesion between the gate wire 61, source wire, and drain wire is improved. In addition, when the above-mentioned wiring is constituted of titanium, silver, and titanium which are explained in the above-mentioned second embodiment, it is possible to obtain the liquid crystal display unit 100 where the electromigration of the gate wire 61, source wire, and drain wire is suppressed. In addition, when the above-mentioned wiring is constituted of chromium, silver, and chromium which is explained in the above-mentioned third embodiment, it is possible to obtain the liquid crystal display unit 100 where the oxidation resistance and scratch resistance of the gate wire 61, source wire, and drain wire is improved. In addition, when the above-mentioned wiring is constituted of manganese, silver, and nickel which is explained in the above-mentioned fourth embodiment, it is possible to obtain the liquid crystal display unit 100 where not only the adhesion of the gate wire 61, source wire, and drain wire is improved, but also the degradation of silver by the plasma processing is suppressed.

Figure 18:
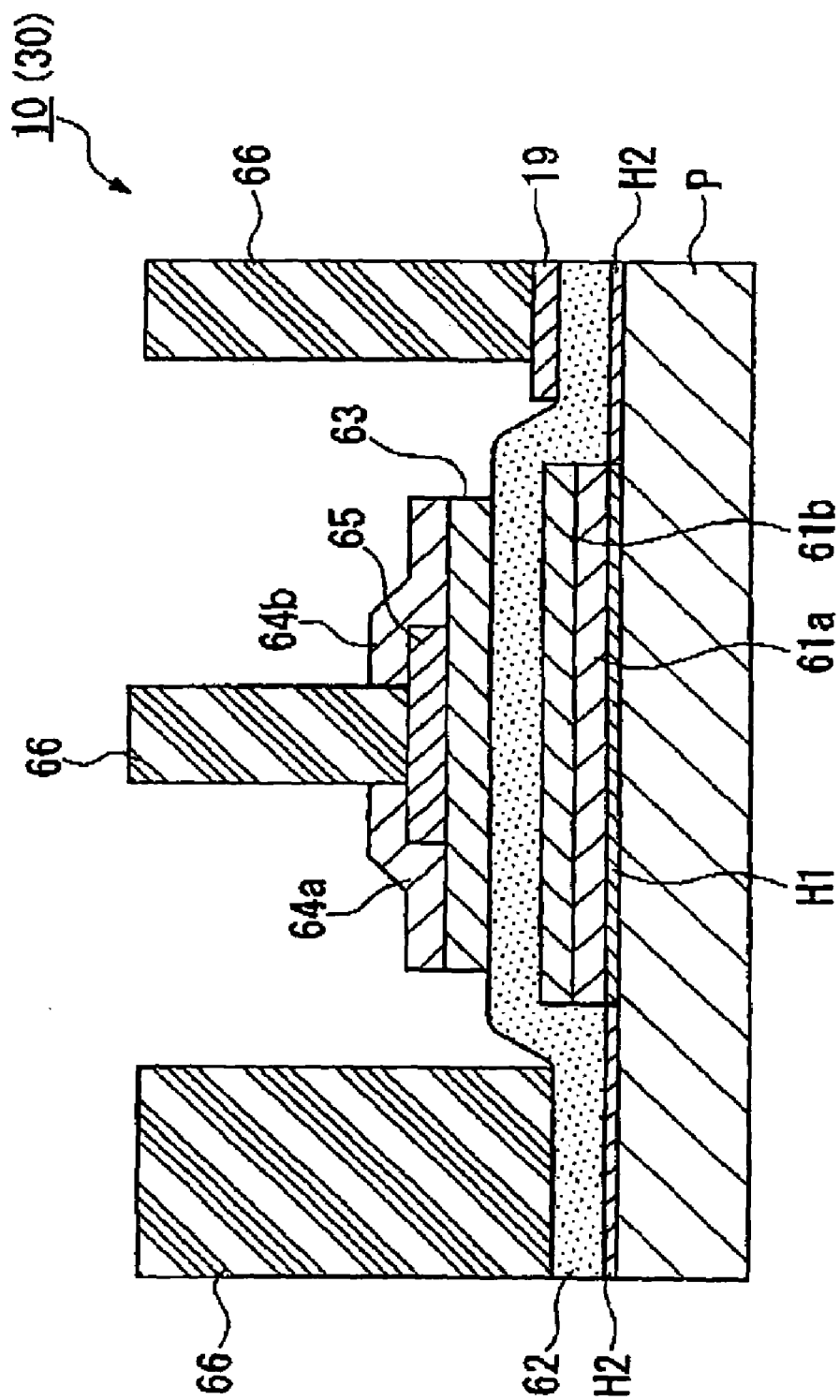
FIG. 18 is a diagram showing a modified example of the liquid crystal display unit shown in FIG. 17.

In addition, in this embodiment, as shown in FIG. 17, although the gate wire 61 is formed between the banks B and B, the present invention is not limited to this, and as shown in FIG. 18, the liquid-affinity section H1 and liquid-repelling section H2 may be formed on the substrate P, and the gate wiring 61 may be formed on the liquid-affinity section H1.

Tenth Embodiment

In the above-mentioned embodiment, although the TFTs 30 are used as switching devices for the driving of the liquid crystal display device 100, this structure is also applicable to, for example, an organic electroluminescent display device in addition to a liquid crystal display device. An organic electroluminescent display device has a structure of sandwiching a thin film, including fluorescent inorganic and organic compounds, with a cathode and an anode. It is a ice which generates excitons by injecting electrons and positive holes (holes) into the above-mentioned thin film and exciting them, and makes light emitted by using the emission of light (fluorescence and phosphorescence) at the time these excitons recombined. Then, it is possible to produce a self-luminescent full-color EL device by patterning materials emitting red, green, and blue luminescent colors respectively, i.e., luminous layer forming materials, and materials forming a hole injection/electronic transporting layer among the fluorescent materials used for an organic electroluminescent display device on the substrate which has the above-described TFTs 30 as ink.

Such an organic electroluminescence device is also included in the scope of the device (electro optical apparatus) in the present invention. It is possible to obtain the organic EL device provided with wiring having a plurality of functions.

Figure 19:
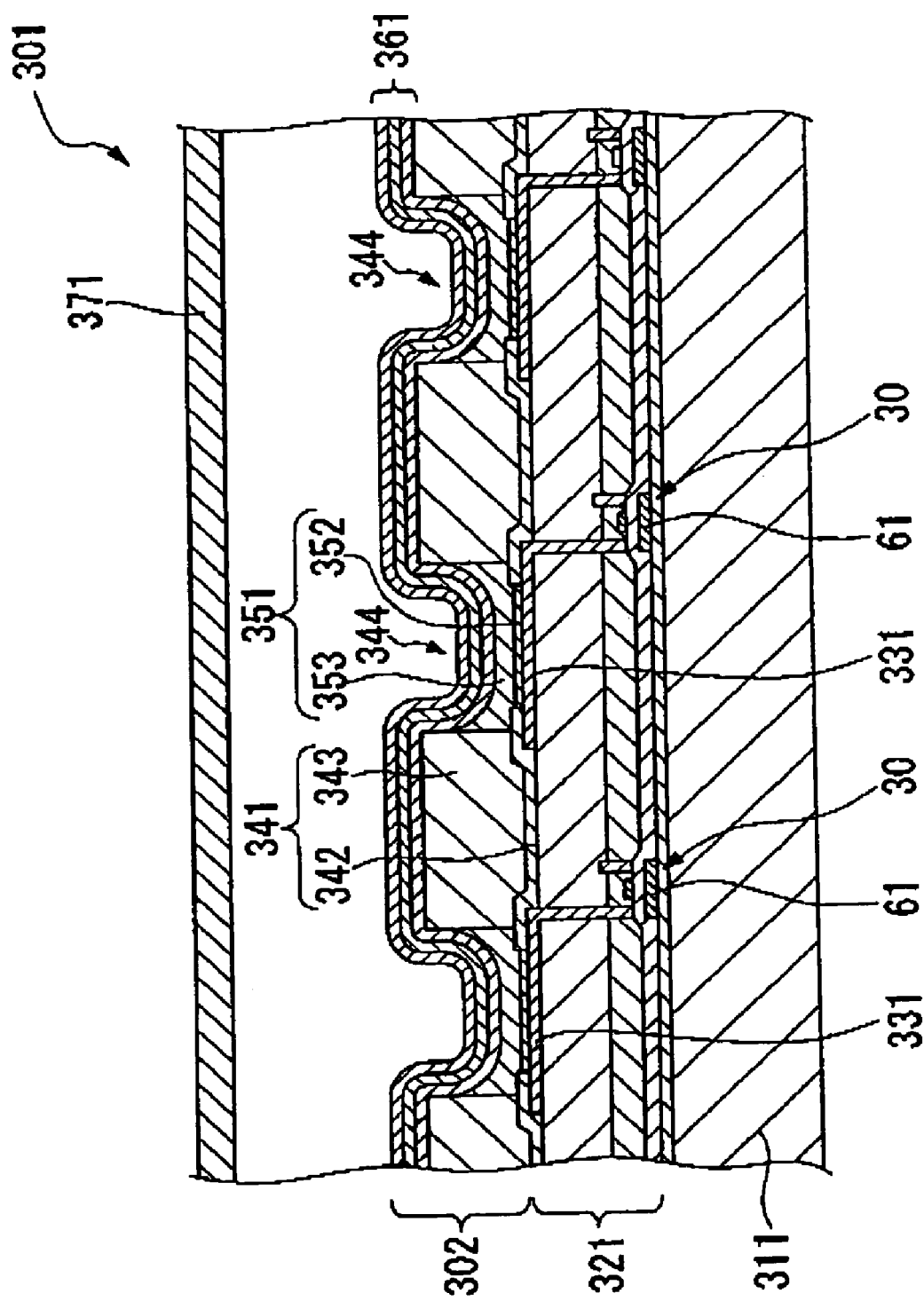
FIG. 19 is a partially enlarged sectional view of an organic EL unit.

FIG. 19 is a sectional side elevation of an organic EL unit some of whose components are produced by the above-mentioned liquid droplet ejecting apparatus IJ. The schematic construction of the organic EL unit will be explained with reference to FIG. 19.

In FIG. 19, an organic electroluminescence unit 301 is constituted by connecting wiring of a flexible board (not shown) and a driving IC (not shown) to an organic EL device 302 that includes a substrate 311, a circuit device section 321, pixel electrodes 331, bank sections 341, light emitting devices 351, a cathode 361 (opposing electrode), and a sealing substrate 371. The circuit device section 321 is constituted by forming the TFTs 30, which are active devices, on the substrate 311, and aligning a plurality of pixel electrodes 331 on the circuit device section 321. Then, the gate wiring 61 which constitutes the TFTs 30 is formed by the fabricating method of a wiring pattern according to the embodiment mentioned above.

Between respective pixel electrodes 331, the bank section 341 is formed in a grid shape, and the light emitting device 351 is formed in a concavity opening 344 caused by the bank section 341. In addition, the light emitting device 351 includes a device which emits red light, a device which emits green light, and a device which emits blue light, and hence, the organic EL unit 301 achieves the fill color display thereby. The cathode 361 is formed all over the bank section 341 and light emitting device 351, and the sealing substrate 371 is stacked on the cathode 361.

The production process of the organic electroluminescence unit 301 including the organic EL device includes a bank section forming step which forms the bank sections 341, a plasma processing step for adequately forming the light emitting device 351, a light emitting device forming step which forms a light emitting device 351, an opposing electrode forming step which forms the cathode 361, and a sealing step which stacks and encapsulates the sealing substrate 371 on the cathode 361.

The light emitting device for step forms the light emitting device 351 by forming the hole injection layer 352 and a luminous layer 353 on a concavity opening 344, i.e., the pixel electrode 331, and includes a hole injection layer forming step and a luminous layer forming step. Then, the hole injection layer forming step includes a first ejecting step in which a liquid object material for forming the hole injection layer 352 is elected onto each pixel electrode 331, and a first drying step which dries the ejected liquid object material and forms the hole injection layer 352. In addition, the luminous layer forming step includes a second ejecting step in which a liquid object material for forming the luminous layer 353 is ejected onto the hole injection layer 352, and a second drying step which dries the ejected liquid object material and forms the luminous layer 353. In addition, as described above, three kinds of luminous layers 353 are formed according to materials corresponding to three colors of red, green, and blue, and hence, the abovementioned second ejecting step includes three steps so as to eject three kinds of materials respectively.

In this light emitting device forming step, the abovementioned liquid droplet ejecting apparatus IJ can be used at the first ejecting step in the hole injection layer forming step, and the second ejecting step in the luminous layer forming step.

Eleventh Embodiment

In the embodiment described above, although the gate wiring of the TFT (thin-film transistor) is formed by using the method for fabricating a pattern according to the present invention it is also possible to produce other components, such as a source electrode, a drain electrode, and a pixel electrode. Hereafter, a method of producing a TFT will be explained with reference to FIGS. 20A to 20D.

Figure 20A:
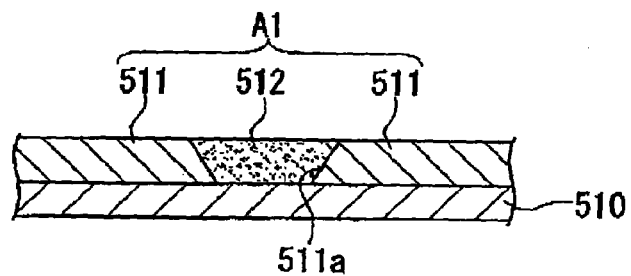
FIGS. 20A to 20D are diagrams for explaining steps of producing a thin-film transistor.

As shown in FIG. 20A, a first layer of bank 511 for providing a groove 511a at ¹/₂₀ to ¹/₁₀ of one pixel pitch is first formed on the upper surface of a washed glass substrate 510 using a photolithography method. It is necessary for this bank 511 be optically transparent and liquid repellent after formation, and those suitably used as material therefor are inorganic materials such as polysilazane in addition to polymeric materials such as an acrylic resin, a polyimide resin, an olefine resin, and a melamine resin.

In order to impart liquid-repellency to the bank 511 after this formation, it is necessary to perform $CF_4$ plasma processing (plasma processing using a gas which has a fluorine component) etc., but instead, the material of the bank 511 itself may be filled with a liquid-repelling component (fluorine group etc.) beforehand. In this case, $CF_4$ plasma processing, etc., is omissible.

It is preferable to a contact angle of 40° or more for the bank 511, which is made liquid-repelling as described above, to the ejection ink, and 10° or less as a contact angle for a glass surface. That is, as a result of the research of the present inventors by experiment, it is possible to secure about 54.0° (10° or less without treatment) as a contact angle after the treatment of the conductive fine particles (tetradecane solvent) when an acrylic resin group is adopted as a material of the bank 511. In addition, these contact angles were obtained under the treatment conditions in which a tetrafluoromethane gas was supplied at 0.1 L/min under a plasma power of 550 W.

At the gate scan electrode forming step following the above-mentioned first layer of bank forming step, the gate scanning electrode 512 is formed by ejecting a liquid droplet including a conductive material by an ink jet so as to fill the inside of the above-mentioned groove 511a which is a drawing area partitioned by the bank 511. Then, when forming the gate scanning electrode 512, the method of forming a pattern according to the present invention is applied.

As a conductive material at this time, Ag, aluminum, Au, Cu, palladium, Ni, W—Si, a conductive polymer, etc., can be suitably adopted. Thus, since sufficient liquid-repellency for bank 511 is imparted beforehand, the gate scanning electrode 512 formed as described above can be formed in a fine wiring pattern without overflowing the groove 511a.

A first electroconductive layer Al made of silver (Ag) having a flat top ace including the bank 511 and gate scanning electrode 512 on the substrate 510 owing to the above steps.

In addition, in order to obtain the good ejection result in the groove 511a, as shown in FIG. 20A, it is preferable to adopt a diverging tapered shape (tapered shape opening toward the ejector) as a shape of this groove 511a. Owing to this, it becomes possible to make the ejected liquid droplet enter deeply thereinto.

Figure 20B:
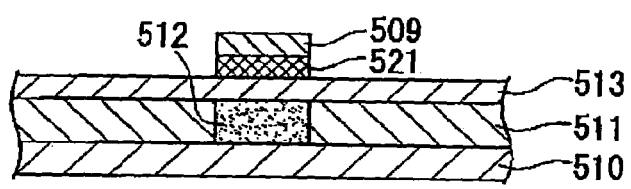

Next, as shown in FIG. 20B, the continuous deposition of the gate insulating film 513, an active layer 521, and a contact layer 509 is performed by a plasma CVD method. A silicon nitride film for the gate insulating film 513, an amorphous silicon film for the active layer 521, and an n⁺ type silicon film for the contact layer 509 are formed by changing material gases and plasma conditions. When forming by the CVD method, 300 to 350° C. heat history is required, built it is possible to avoid a problem about transparency and heat resistance by using an inorganic material for the bank.

Figure 20C:
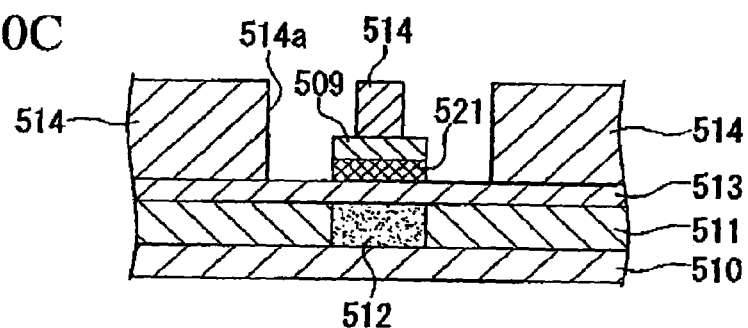

At a second layer of bank forming step following the above-mentioned semiconductor layer forming step, as shown in FIG. 20C, a second layer of bank 514 for providing the groove 514a, which is ¹/₂₀ to ¹/₁₀ of one pixel pitch and intersects with the above-mentioned groove 511a, is formed on the gate insulating film 513 using a photolithography method. It is necessary for this bank 514 be optically transparent and liquid-repellent after formation, and those suitably used as material therefor are inorganic materials such as polysilazane, in addition to polymeric materials such as an acrylic resin, a polyimide resin, an olefine resin, and a melamine resin.

In order to impart liquid-repellency to the bank 514 after this formation, it is necessary to perform $CF_4$ plasma processing (plasma processing using a gas which has a fluorine component) etc., and instead, the material of the bank 514 itself may be filled with a liquid-repelling component (fluorine group etc.) beforehand. In this case, $CF_4$ plasma processing, etc., may be omitted It is preferable to secure a contact angle of 40° or more for the bank 514, which is made liquid-repelling as described above, to the ejection ink.

Figure 20D:
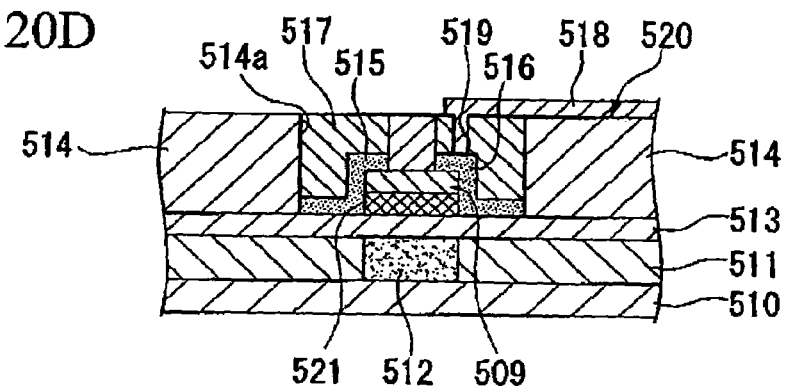

At a source/drain electrode forming step following the above-mentioned second layer of bank forming step, the source electrode 515 and drain electrode 516, which intersect with the above-mentioned gate scanning electrode 512 as shown in FIG. 20D, are formed by ejecting a liquid droplet including a conductive material by an ink jet so as to fill the inside of the above-mentioned groove 514a which is a drawing area partitioned by the bank 514. Then, when forming the source electrode 515 and drain electrode 516, the method of forming a pattern according to the present invention is applied.

As a conductive material at this time, Ag, aluminum, Au, Cu, palladium, Ni, W—Si, a conductive polymer, etc. can be suitably adopted. Thus, since sufficient liquid-repellency for bank 514 is imparted beforehand, the source electrode 515 and drain electrode 516 formed as described above can be formed in a fine wiring pattern without overflowing the groove 514a.

In addition, an insulator 517 is disposed so that the groove 514a where the source electrode 515 and drain electrode 516 are disposed may be filled. A flat top surface 520 including the bank 514 and insulator 517 is formed on the substrate 510 owing to the above steps.

Then, while forming a contact hole 519 in the insulator 517, a pixel electrode (ITO) 518 patterned on the top surface 520 is formed, and the TFT is formed by connecting the drain electrode 516 and pixel electrode 518 via the contact hole 519.

Twelfth Embodiment

Figure 21:
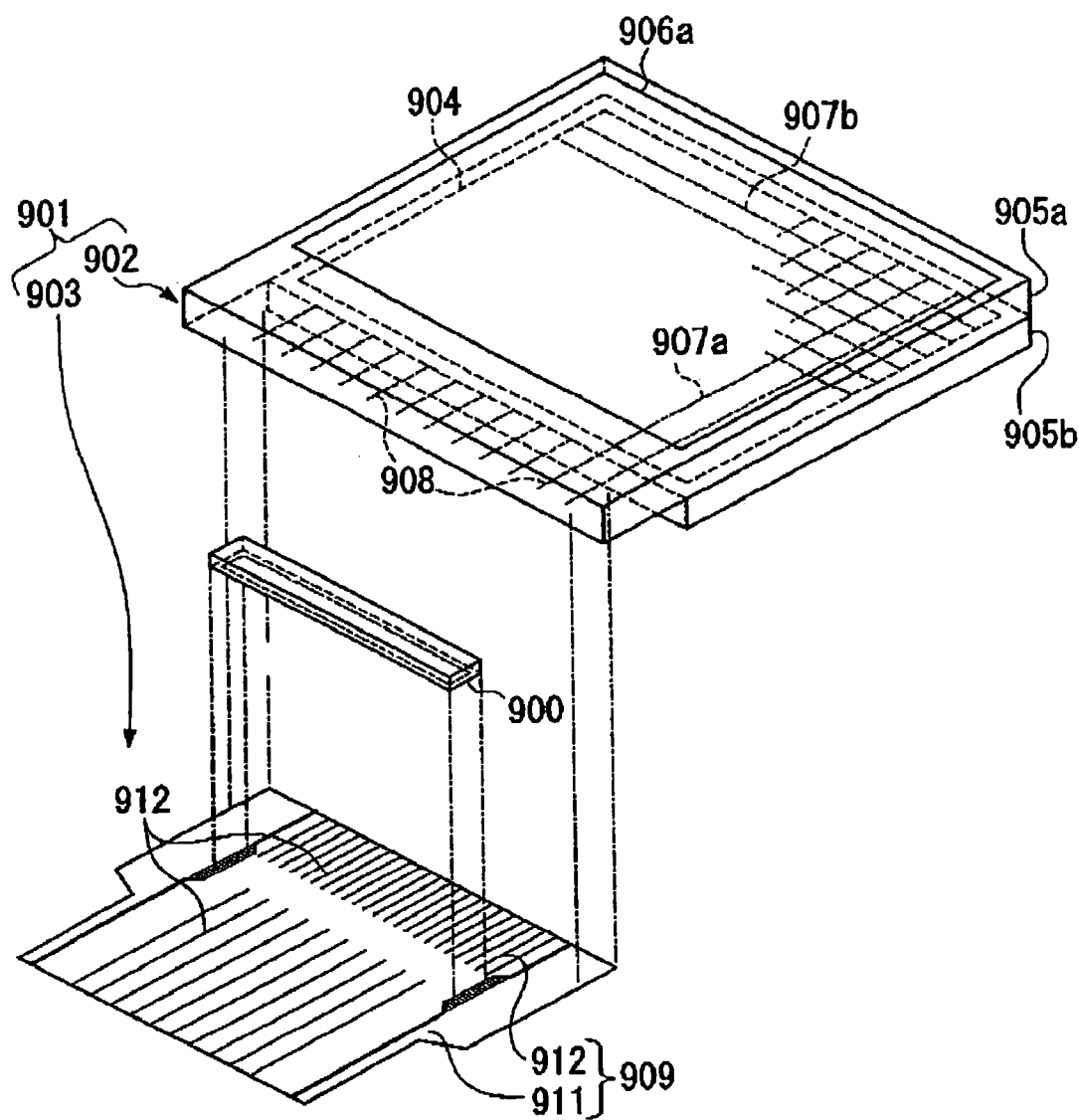
FIG. 21 is a diagram showing another embodiment of the liquid crystal display unit.

FIG. 21 is a diagram showing another embodiment of a liquid crystal display device.

A liquid crystal display unit (electro-optical apparatus) 901 shown in FIG. 21 includes a color liquid crystal panel (electro-opticals panel) 902, and a circuit substrate 903 connected to the liquid crystal panel 902. In addition, lighting systems such as a back light, and other incidental equipment are attached to the liquid crystal panel 902 if necessary.

The liquid crystal panel 902 has a pair of substrates 905a and substrate 905b which are bonded with a sealant 904. In addition, liquid crystal is enclosed in a gap formed between these substrates 905a and 905b, which is the so-called cell gap. Generally, these substrates 905a and 905b are formed of a translucent material, for example, glass, a synthetic resin, etc. A polarizing plate 906a and another polarizing plate are adhered on the outside surface of the substrates 905a and 905b. In addition, in FIG. 21, the illustration of the another polarizing plate is omitted.

In addition, an electrode 907a is formed on the inner surface of the substrate 905a, and an electrode 907b is formed on the inner surface of the substrate 905b. These electrodes 907a and 907b are formed in a proper pattern state such as a stripe shape, characters, and numerals in addition, these electrodes 907a and 907b are formed, for example, with a translucent material such as ITO. The substrate 905a has an overhang section protruding ahead of the substrate 905b, and a plurality of terminals 908 is formed on this overhang section. These terminals 908 are formed concurrently with the electrode 907a when forming the electrode 907a on the substrate 905a. Therefore, these terminals 908 are formed, for example, of ITO. These terminals 908 include one extending from the electrode 907a integrally and another one connected to the electrode 907b via a conductive material (not shown).

A semiconductor device 900 as a liquid crystal driving IC is mounted in a predetermined position on a wiring board 909 in the circuit board 903. In addition, although illustration is omitted, a resistor, a capacitor, and other chips may be mounted in predetermined positions of parts other than the part in which a semiconductor device 900 is mounted. The wiring board 909 is produced by forming a wiring pattern 912 by patterning metal films such as a Cu film formed on the base substrate 911 which is a flexible film such as a polyimide film.

In this embodiment, a wiring pattern 912 in the electrodes 907a and 907b, and a circuit board 903 in the liquid crystal panel 902 is formed by the above-mentioned device production method.

According to the liquid crystal display device of this embodiment, it is possible to obtain the liquid crystal display device provided with wiring having a plurality of functions.

In addition, although the example mentioned above is a passive liquid crystal panel, an active matrix liquid crystal panel may also be used. That is, thin-film transistors (TFTs) are formed on one substrate, and a pixel electrode is formed for each TFT. In addition, it is possible to form the wiring (gate wiring, source wiring) electrically connected to each TFT by using ink jet technology as mentioned above. On the other hand, opposing electrodes, etc., are formed on an opposing substrate. The present invention is also applicable to such an active matrix liquid crystal panel.

Thirteenth Embodiment

Figure 22:
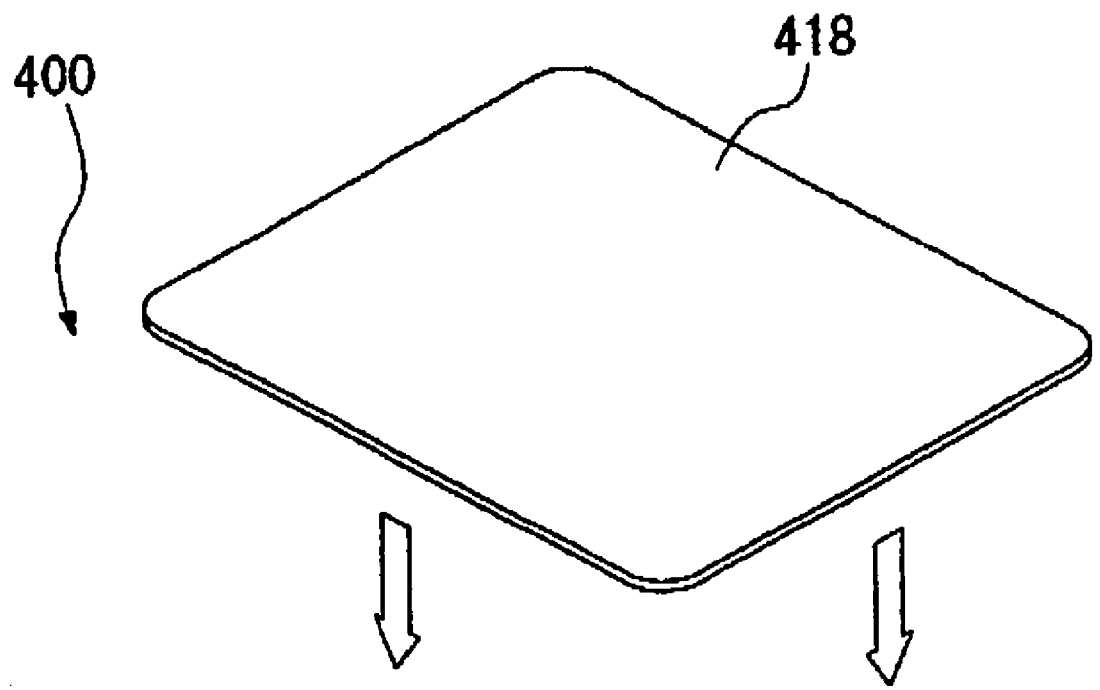
FIG. 22 is an exploded perspective view of a noncontact type card medium.
Figure 22:
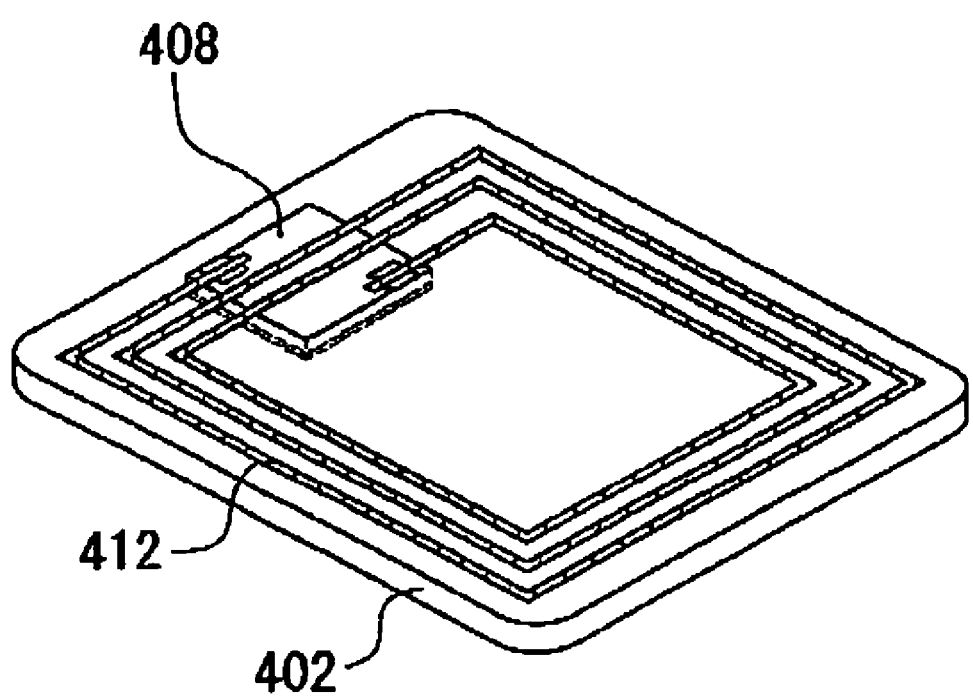

An embodiment of a noncontact type card medium will be explained as a thirteenth embodiment. As shown in FIG. 22, a noncontact type card medium (electronic apparatus) 400 according to this embodiment incorporates a semiconductor integrated circuit chip 408 and an antenna circuit 412 in a case including a card base 402 and a card cover 418. At least one of power supply and data transfer is executed by at least one of an electromagnetic wave and electrostatic capacitor coupled with an external transceiver.

In this embodiment, the above-mentioned antenna circuit 412 is formed by a pattern formed by stacking a plurality of materials formed by the method for fabricating a pattern according to the above-mentioned embodiment.

Therefore, it is possible to produce the noncontact type card medium equipped with the antenna circuit 412 which has a plurality of functionalities.

In addition, the present invention is also applicable to a plasma display panel (PDP), and a surface conduction type electron-emitting device, which uses a phenomenon in which electron emission occurs by flowing a current in parallel to a film surface in a thin film with a small area which is formed on the substrate, in addition to the above-described as a device (electro-optical apparatus) according to the present invention Fourteenth Embodiment As a fourteenth embodiment, a specific example of the electronic apparatus of the present invention will be explained.

Figure 23A:
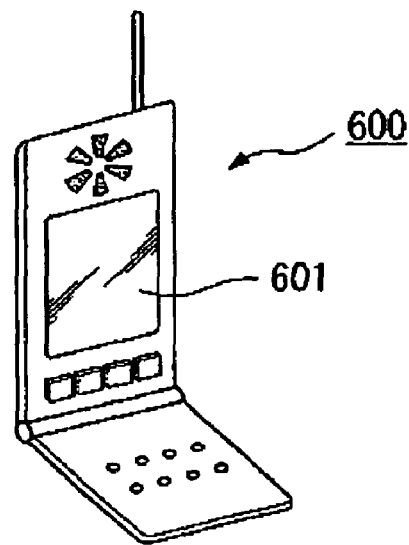
FIGS. 23A to 23C are diagrams showing examples of an electronic apparatus of the present invention.

FIG. 23A is a perspective view showing an example of a cellular phone. In FIG. 23A, reference numeral 600 denotes a cellular phone body and numeral 601 denotes a liquid crystal display section provided with the liquid crystal display unit of the above-mentioned embodiment.

Figure 23B:
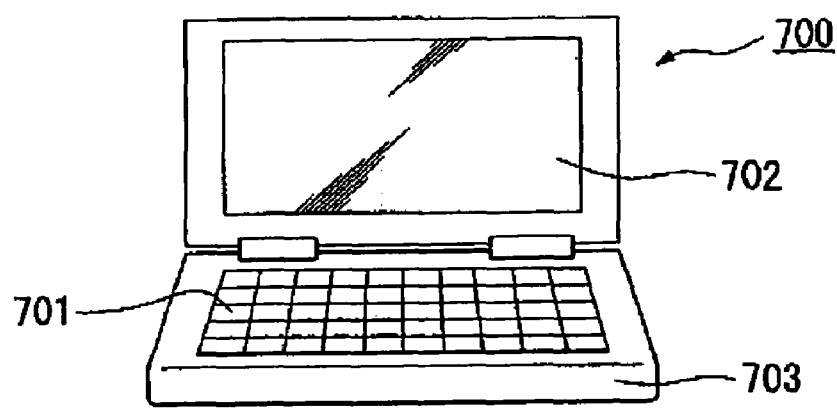

FIG. 23B is a perspective view showing an example of a portable information processing apparatus such as a word processor and a personal computer. In FIG. 23B, reference numeral 700 denotes an information processing unit, numeral 701 denotes an input section such as a keyboard, numeral 703 denotes an information processing unit main body, and numeral 702 denotes a liquid crystal display section provided with the liquid crystal display unit of the above-mentioned embodiment.

Figure 23C:
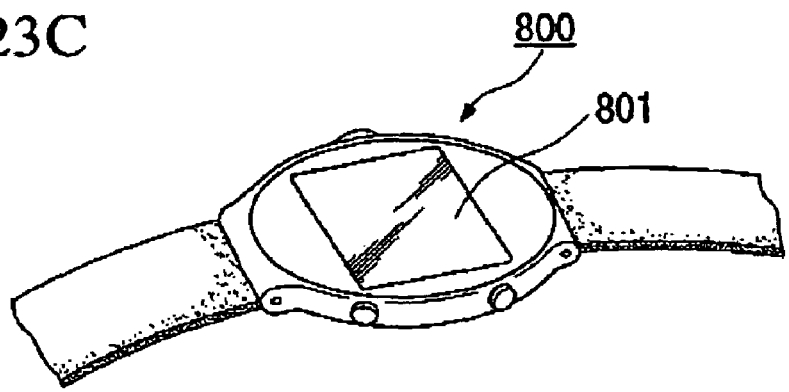

FIG. 23C is a perspective view showing an example of a wristwatch type electronic apparatus. In FIG. 23C, reference numeral 800 denotes a watch body and numeral 801 denotes a liquid crystal display section provided with the liquid crystal display unit of the above-mentioned embodiment.

Since the electronic apparatuses shown in FIGS. 23A to 23C each include the liquid crystal display unit of the above-mentioned embodiment, it becomes possible to provide an electronic apparatus equipped with a pattern which has a plurality of functionalities.

In addition, although it is designed such that the electronic apparatus of his embodiment includes a liquid crystal apparatus, it is also possible to make it an electronic apparatus provided with another electro-optical apparatus such as an organic electroluminescent display unit or a plasma display unit.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for fabricating a pattern on a substrate, comprising the steps of:
    forming banks according to formation areas of the pattern on the substrate;
    disposing liquids between the banks, the liquids differing from each other; and
    applying predetermined treatments to the liquids which are disposed between the banks so as to form the pattern with plural materials stacked one on the other, wherein
    the liquids comprise a first function liquid having a main material which provides a main function to the pattern, and a second function liquid having a material which provides an additional function to the pattern, and wherein
    the second function liquid has a material for enhancing adhesion between the main material and the substrate.

2. The method for fabricating a pattern according to claim 1, wherein, in the step of disposing the liquids, the second function liquid, which is different from the first function liquid, is disposed on the first function liquid after solidifying the first function liquid so that the first and second function liquids are disposed between banks.

3. The method for fabricating a pattern according to claim 1, further comprising a step of imparting liquid-repellency to surfaces of the banks before disposing the first and second function liquids between the banks.

4. The method for fabricating a pattern according to claim 1, further comprising a step of imparting liquid-affinity to a surface of the substrate exposed between the banks before disposing the first and second function liquids between the banks.

5. The method for fabricating a pattern according to claim 1, wherein the first and second function liquids include conductive fine particles.

6. The method for fabricating a pattern according to claim 1, wherein the first and second function liquid include a material which exhibits electroconductivity by being subjected to a heat treatment or a light irradiation treatment.

7. A method for fabricating a device, comprising a step of forming a pattern on a substrate using the method for fabricating a pattern according to claim 1.

8. A method for fabricating a pattern on a substrate, comprising the steps of:
    forming a function liquid application region corresponding to a formation region of the pattern, and a liquid-repelling region surrounding the function liquid application region, on the substrate;
    disposing liquids on the function liquid application region, the liquids differing from each other; and
    applying predetermined treatments to the liquids which are disposed on the function liquid application region so as to form the pattern with plural materials stacked one on the other, wherein
    the liquids comprise a first function liquid having a main material which provides a main function to the pattern, and a second function liquid having a material which provides an additional function to pattern, and wherein
    the second function liquid has a material for enhancing adhesion between the main material and the substrate.

9. The method for fabricating a pattern according to claim 8, wherein, in the step of disposing the liquids, the second function liquid, which is different from the first function liquid, is disposed on the first function liquid after solidifying the first function liquid that has been disposed on the function liquid application region so that the first and second function liquids are disposed on the function liquid application region.

10. The method for fabricating a pattern according to claim 8, wherein the liquid-repelling region is a region which is made liquid-repelling by forming a monomolecular film on the substrate.

11. The method for fabricating a pattern according to claim 10, wherein the monomolecular film is a self-organizing film made of organic molecules.

12. The method for fabricating a pattern according to claim 8, wherein the liquid-repelling region is a region which is made liquid-repelling by forming a fluoro-polymer film on the substrate.

13. The method for fabricating a pattern according to claim 8, wherein the first and second function liquids include conductive fine particles.

14. The method for fabricating a pattern according to claim 8, wherein the first and second function liquid include a material which exhibits electroconductivity by being subjected to a heat treatment or a light irradiation treatment.

15. A method for fabricating a device, comprising a step of forming a pattern on a substrate using the method for fabricating a pattern according to claim 8.

16. A method for fabricating an active matrix substrate, comprising:

a first step of forming a gate wiring on a substrate;

a second step of forming a gate insulating film on the gate wiring;

a third step of stacking a semiconductor layer while having the gate insulating film intervened;

a fourth step of forming a source electrode and a drain electrode on the gate insulating film;

a fifth step of disposing an insulating material on the source electrode and the drain electrode; and a sixth step of forming a pixel electrode on the insulating material, wherein at least one of the first step, the fourth step, and the sixth step uses a method for fabricating a pattern on a substrate, comprising the steps of:

forming banks according to formation areas of the pattern on the substrate;

disposing liquids between the banks, the liquids differing from each other; and applying predetermined treatments to the liquids which are disposed between the banks so as to form the pattern with plural materials stacked one on the other, wherein the liquids comprise a first function liquid having a main material which provides a main function to the pattern, and a second function liquid having a material which provides an additional function to the pattern.

17. A method for fabricating an active matrix substrate, comprising:

a first step of forming a gate wiring on a substrate;

a second step of forming a gate insulating film on the gate wiring;

a third step of stacking a semiconductor layer while having the gate insulating film intervened;

a fourth step of forming a source electrode and a drain electrode on the gate insulating film;

a fifth step of disposing an insulating material on the source electrode and the drain electrode; and a sixth step of forming a pixel electrode on the insulating material, wherein at least one of the first step, the fourth step, and the sixth step uses a method for fabricating a pattern on a substrate, comprising the steps of:

forming a function liquid application region corresponding to a formation region of the pattern, and a liquid-repelling region surrounding the function liquid application region, on the substrate;

disposing liquids on the function liquid application region, the liquids differing from each other; and applying predetermined treatments to the liquids which are disposed on the function liquid application region so as to form the pattern with plural materials stacked one on the other, wherein the liquids comprise a first function liquid having a main material which provides a main function to the pattern, and a second function liquid having a material which provides an additional function to the pattern.

18. A method for fabricating a pattern on a substrate, comprising the steps of:

forming banks according to formation areas of the pattern on the substrate;

disposing liquids between the banks, the liquids differing from each other; and applying predetermined treatments to the liquids which are disposed between the banks so as to form the pattern with plural materials stacked one on the other, wherein the liquids comprise a first function liquid having a main material which provides a main function to the pattern, and a second function liquid having a material which provides an additional function to the pattern, and wherein the second function liquid has a material for suppressing electromigration of the main material.

19. A method for fabricating a pattern on a substrate, comprising the steps of:

forming banks according to formation areas of the pattern on the substrate;

disposing liquids between the banks, the liquids differing from each other; and applying predetermined treatments to the liquids which are disposed between the banks so as to form the pattern with plural materials stacked one on the other, wherein the liquids comprise a first function liquid having a main material which provides a main function to the pattern, and a second function liquid having a material which provides an additional function to the pattern, and wherein the second function liquid has a material for preventing oxidation of the main material.

20. A method for fabricating a pattern on a substrate, comprising the steps of:

forming banks according to formation areas of the pattern on the substrate;

disposing liquids between the banks, the liquids differing from each other; and applying predetermined treatments to the liquids which are disposed between the banks so as to form the pattern with plural materials stacked one on the other, wherein the liquids comprise a first function liquid having a main material which provides a main function to the pattern, and a second function liquid having a material which provides an additional function to the pattern, and wherein the second function liquid has a material for preventing damage of the main material.

21. A method for fabricating a pattern on a substrate, comprising the steps of:

forming a function liquid application region corresponding to a formation region of the pattern, and a liquid-repelling region surrounding the function liquid application region, on the substrate;

disposing liquids on the function liquid application region, the liquids differing from each other; and applying predetermined treatments to the liquids which are disposed on the function liquid application region so as to form the pattern with plural materials stacked one on the other, wherein the liquids comprise a first function liquid having a main material which provides a main function to the pattern, and a second function liquid having a material which provides an additional function to the pattern, and wherein the second function liquid has a material for suppressing electromigration of the main material.

22. A method for fabricating a pattern on a substrate, comprising the steps of:

forming a function liquid application region corresponding to a formation region of the pattern, and a liquid-repelling region surrounding the function liquid application region, on the substrate;

disposing liquids on the function liquid application region, the liquids differing from each other; and applying predetermined treatments to the liquids which are disposed on the function liquid application region so as to form the pattern with plural materials stacked one on the other, wherein the liquids comprise a first function liquid having a main material which provides a main function to the pattern, and a second function liquid having a material which provides an additional function to the pattern, and wherein the second function liquid has a material for preventing oxidation of the main material.

23. A method for fabricating a pattern on a substrate, comprising the steps of:

forming a function liquid application region corresponding to a formation region of the pattern, and a liquid-repelling region surrounding the function liquid application region, on the substrate;

disposing liquids on the function liquid application region, the liquids differing from each other; and applying predetermined treatments to the liquids which are disposed on the function liquid application region so as to form the pattern with plural materials stacked one on the other, wherein the liquids comprise a first function liquid having a main material which provides a main function to the pattern, and a second function liquid having a material which provides an additional function to the pattern, and wherein the second function liquid has a material for preventing damage of the main material.

* * * * *